(12) United States Patent
Jain et al.

(10) Patent No.: US 8,244,562 B2
(45) Date of Patent: Aug. 14, 2012

(54) SEQUENCE OF ALGORITHMS TO COMPUTE EQUILIBRIUM PRICES IN NETWORKS

(75) Inventors: Kamal Jain, Bellevue, WA (US); Vijay Vazirani, Atlanta, GA (US)

(73) Assignee: Microsoft Corporation, Redmond, WA (US)

( * ) Notice: Subject to any disclaimer, the term of this patent is extended or adjusted under 35 U.S.C. 154(b) by 1046 days.

(21) Appl. No.: 11/754,877

(22) Filed: May 29, 2007

(65) Prior Publication Data

US 2008/0103793 A1 May 1, 2008

Related U.S. Application Data

(60) Provisional application No. 60/863,174, filed on Oct. 27, 2006.

(51) Int. Cl.
*G06Q 30/00* (2006.01)
(52) U.S. Cl. ............... 705/7; 705/10; 705/37
(58) Field of Classification Search ........... 705/7, 10, 705/37
See application file for complete search history.

(56) References Cited

U.S. PATENT DOCUMENTS

| 6,961,685 | B2 | 11/2005 | Sy | |
|---|---|---|---|---|
| 6,968,323 | B1 | 11/2005 | Bansal et al. | |
| 7,392,215 | B1* | 6/2008 | Bril | 705/37 |
| 2004/0024687 | A1 | 2/2004 | Delenda | |
| 2005/0187803 | A1* | 8/2005 | Jain et al. | 705/7 |
| 2005/0207531 | A1 | 9/2005 | Dempsey et al. | |
| 2005/0259648 | A1 | 11/2005 | Kodialam et al. | |
| 2005/0278240 | A1* | 12/2005 | Delenda | 705/37 |
| 2006/0095306 | A1 | 5/2006 | Parker et al. | |
| 2006/0111951 | A1* | 5/2006 | Jain | 705/7 |
| 2006/0116917 | A1 | 6/2006 | Jain | |
| 2006/0146716 | A1 | 7/2006 | Lun et al. | |
| 2006/0167784 | A1 | 7/2006 | Hoffberg | |

OTHER PUBLICATIONS

Iwata et al., "A Combinatorial Strongly Polynomial Algorithm for Minimizing Submodular Functions", Dec. 2000.*
Arrow, et al. Competitive stability under weak gross substitutibility: The 'Euclidean distance' approach. International Economic Review, 1:38-49, 1960.
Schrijver. "Theory of linear and integer programming," John Wiley and Sons, 1986.
Ahlswede, et al.. "Network information flow," IEEE Trans. on Information Theory, 46: 1204-1216, 2000.
Devanur,et al. "Market Equilibrium via a Primal-Dual Algorithm for a Convex Program," http://www-static.cc.gatech.edu/~vazirani/market.ps, last accessed Dec. 1, 2006, 15 pages.
Devanur,et al. Market Equilibrium via a Primal-Dual-Type Algorithm,: http://www.stanford.edu/~saberi/market.pdf, last accessed Dec. 1, 2006, 14 pages.
Chang, et al. "An Improved Primal Simplex Variant for Pure Processing Networks," ACM Transactions on Mathematical Software, Mar. 1989, 15 pages, vol. 15.
Hajiaghayi, et al. "The Prize-Collecting Generalized Steiner Tree Problem via a New Approach of Primal-Dual Schema," SODA '06, Jan. 22, 2006, 10 pages, Miami, Florida.

(Continued)

*Primary Examiner* — Nga B. Nguyen
(74) *Attorney, Agent, or Firm* — Lee & Hayes, PLLC

(57) ABSTRACT

The claimed subject matter provides an architecture for facilitating equilibrium solutions for resource allocation markets. One particular example of such markets can be a computer network environment. The architecture can model buyers as nodes and suppliers as edges, incorporating notions of an ascending price auction in order to provide optimal equilibrium solution to Eisenberg-Gale type convex programs in strongly polynomial time.

18 Claims, 10 Drawing Sheets

OTHER PUBLICATIONS

Barahona. "Packing spanning trees," Mathematics of Operation Research, 20: 104-115, 1995.

Brainard, et al. "How to compute equilibrium prices in 1891," Cowles Foundation Discussion Paper, (1270), 2000.

Chen, et al. "Fisher equilibrium price with a class of concave utility functions," in ESA, pp. 169-179, 2004.

Cunningham. "Minimum cuts, modular functions and matroid polyhedra," Networks, 15: 205-215, 1985.

Codenotti, et al. "Efficient computation of equilibrium prices for markets with Leontief utilities," Proc. 31st International Colloquium on Automata, Languages, and Programming, Lecture Notes in Computer Science, 2004.

Dahlhaus, et al. "The complexity of multiterminal cuts," SIAM Journal on Computing, 23:864-894, 1994.

Deng, et al. "On the complexity of equilibria," Proceedings of ACM Symposium on Theory of Computing, 2002.

Devanur, et al. "Market equilibrium via a primal-dual-type algorithm," Proceedings of IEEE Annual Symposium on Foundations of Computer Science, 2002.

Devanur, et al. "The spending constraint model for market equilibrium: Algorithmic, existence and uniqueness results," Proceedings of 36th STOC, 2004.

Edmonds. "Maximum matching and a polyhedron with 0,1-vertices," Journal of Research of the National Bureau of Standards. Section B, 69: 125-130, 1965.

Edmonds. "Optimum branchings," Journal of Research of the National Bureau of Standards. Section B, 71: 233-240, 1967.

Eisenberg. "Aggregations of utility functions," Management Sciences, 7:337-350, 1961.

Fleischer, et al. "A strongly polynomial-time algorithm for minimizing submodular functions," Journal of the ACM, 48: 761-777, 2001.

Garg, et al. "A primal-dual algorithm for computing Fisher equilibrium in absence of gross substitutibility property," Proceedings of Wine, 2005.

Garg, et al. "Auction algorithms for market equilibrium," Proceedings of the 36th STOC, 2004.

Garg, et al. "An auction based market equilibrium algorithm for the separable gross substitutibility case," Proceedings, APPROX, 2004.

Goel, et al. "Approximate majorization and fair online load balancing," SODA, 2001.

Garg, et al. "Multiway cuts in directed and node weighted graphs," Proc. 21st International Colloquium on Automata, Languages, and Programmings, vol. 820 of Lecture Notes in Computer Science, pp. 487-498. Springer-Verlag, Berlin, 1994.

Hu. "Multicommodity network flows," Operations Research, 14: 344-360, 1963.

Jacobson. "Congestion avoidance and control," ACM Sigcomm, pp. 314-329, 1988.

Jain. "A polynomial time algorithm for computing the Arrow-Debreu market equilibrium for linear utilities," FOCS, 2004.

Jain, et al. "Approximation algorithms for the metric facility location and κ-median problems using primal-dual schema and Lagrangian relaxation," Journal of the ACM, 48:274-296, 2001.

Jain, et al. "Equitable cost allocations via primal-dual-type algorithms," Proceedings of 33rd ACM Symposium on Theory of Computing, 2002.

Jain, et al. "Market equilibrium for homothetic, quasi-concave utilities and economics of scale in production," Proceedings, SODA, 2005.

Kelly. "Charging and rate control for elastic traffic," European Transactions on Telecommunications, 8: 33-37, 1997.

Kelly. "Fairness and stability of end-to-end congestions control," European Journal of Control, 9:159-176, 2003.

Kelly, et al. "Rate control in communication networks," Journal of Operational Research Society, 49: 237-252, 1998.

Koutsoupias, et al. "Worst case equilibria," Proceedings of STACS, 1999.

Kelly, et al. "Rate control as a market equilibrium," Manscript, 2002.

Megiddo. "Cost allocation for Steiner trees," Networks, 8:1-6, 1978.

Nash-Williams. "Edge-disjoint spanning trees of finite graphs," J. London Math. Soc., 36:445-450, 1961.

Schrijver. "A combinatorial algorithm minimizing submodular functions in strongly polynomial time," Combinational Theory, Series B, 80:346-355, 2000.

Shapley. "On balanced sets and cores," Naval Research Logistics Quarterly, 14: 453-460, 1967.

Tutte. "On the problem of decomposing a graph into n connected factors," J. London Math Soc., 36:221-230, 1961.

Wang, et al. "Cross-layer optimization in TCP/IP networks," IEEE/ACM Trans. on Networking, 13:582-268, 2005.

Eisneberg, et al. "Consensus of subjective probabilities: the Pari-Mutuel method," The Annals of Mathematical Statistics, 30: 165-168, 1959.

* cited by examiner

SEQUENCE OF ALGORITHMS TO COMPUTE EQUILIBRIUM PRICES IN NETWORKS

CROSS-REFERENCE TO RELATED APPLICATIONS

This application claims the benefit of U.S. Provisional Application Ser. No. 60/863,714, filed Oct. 31, 2006, entitled "COMPUTING EQUILIBRIUM IN NETWORKS." The entirety of this application and associated Appendix is incorporated herein by reference.

BACKGROUND OF THE INVENTION

The phenomenal success of TCP, and, in particular, the congestion control protocol of Jacobson, has played a central role in the unprecedented growth of the Internet. These protocols have scaled gracefully all the way from a small-scale research network to today's Internet with the tens of millions of end nodes and links, the highly heterogeneous composition and growth, and the very diverse collection of users and applications. This remarkable success has attracted much theoretical study, with a view to designing next generation protocols. This activity has so far been centered around continuous time algorithms, which do not have time-efficiency guarantees.

Conventionally, convex programs can be employed to find equilibrium solution, but are very slow and/or resource intensive. On the other hand, combinatorial optimization can be more efficient process under certain circumstances. A central theme within combinatorial optimization was the design of combinatorial algorithms for solving specific classes of linear programs. This not only led to the most efficient known algorithms for such fundamental problems as matching, flow, shortest paths and branchings, but also to a deep understanding of the structure underlying these problems.

This naturally raises the question of obtaining combinatorial algorithms for solving nonlinear programs. A step in this direction was recently taken by N. Devanur, et al., who gave a combinatorial polynomial time algorithm for computing an equilibrium for the linear case of Fisher's market equilibrium model described by W. C. Brainard and H. E. Scarf. N. Devanur, et al. appears to be the first combinatorial algorithm for exactly solving a nonlinear program—the Eisenberg and Gale convex program, which gives, as its optimal solution, equilibrium allocations for this model.

In retrospect, the Eisenberg and Gale convex program was a fine starting point for the question raised above. This remarkable program helps prove, in a very simple manner, basic properties of the set of equilibria: Equilibrium exists under certain (mild) conditions, the set of equilibria is convex, equilibrium utilities and prices are unique, and if the program has all rational entries then equilibrium allocations and prices are also rational. In addition, it also provides a means for characterizing the equilibrium in a combinatorial manner as described by K. Jain, showing that equilibrium utilities satisfy proportional fairness, and approximating it to any specified degree using an ellipsoid algorithm.

The Eisenberg-Gale program maximizes a money weighted geometric mean of buyers' utilities subject to linear packing constraints. What is lacking is a study of combinatorial solvability of several resource allocation markets whose equilibria are captured via convex programs having the same form as the Eisenberg-Gale program. Such algorithms could lead to new insights into the efficiency, fairness, and competition monotonicity of these markets.

SUMMARY OF THE INVENTION

The following presents a simplified summary of the claimed subject matter in order to provide a basic understanding of some aspects of the claimed subject matter. This summary is not an extensive overview of the claimed subject matter. It is intended to neither identify key or critical elements of the claimed subject matter nor delineate the scope of the claimed subject matter. Its sole purpose is to present some concepts of the claimed subject matter in a simplified form as a prelude to the more detailed description that is presented later.

The subject matter disclosed and claimed herein, in one aspect thereof, comprises computer-implemented techniques for employing strongly polynomial combinatorial algorithms for finding equilibria for several natural resource allocation markets (NRAM). As one example of a NRAM, consider a computer network environment. Various entities can be employing the network for their own needs. Utilization of network resources can have inherent value for the various entities. For instance, moving data from point A to point B (e.g., nodes of a network) can have particular utility to the various entities, even though the route (e.g., an edge of a network) from point A to point B may not matter.

On the other hand, edge utilization (e.g., demand for a particular supplier or in the case of a computer network a particular path) can have very important effects on the network itself. Each edge of a network has a bandwidth (e.g., supply) beyond which congestion occurs. In economic circles, the price at which supply equals demand is thought of as equilibrium. Likewise, in a network, the price at which supply equals demand can also be considered as a point of equilibrium. Thus, given the reasonable assumption that the various entities described above are bound by a budget, a price increase for utilization of a congested edge can result in a convergence toward equilibrium in polynomial time for that edge due to well-known tenets of economics.

In accordance therewith, the claimed subject matter can examine traffic along the edges of a network in order to determine whether the demand exceeds the supply. If so, a price for using this edge (e.g., the price charged for routing a unit of flow) can be increased so that the edge will tend toward equilibrium. It is to be appreciated that all (or a subset) of edges can be examined either in turn or in unison and price increases for particular edges (e.g. edges that exhibit congestion) can be applied simultaneously and in equal increments. It is also to be appreciated that specifically suited solutions can be applied to a point-to-point topology (e.g., a peer-to-peer model or client-server model) as well as to broadcast topology (e.g. a set of nodes that communicate with each or many members of the set).

The following description and the annexed drawings set forth in detail certain illustrative aspects of the claimed subject matter. These aspects are indicative, however, of but a few of the various ways in which the principles of the claimed subject matter may be employed and the claimed subject matter is intended to include all such aspects and their equivalents. Other advantages and distinguishing features of the claimed subject matter will become apparent from the following detailed description of the claimed subject matter when considered in conjunction with the drawings.

DESCRIPTION OF THE INVENTION

Figure 1:
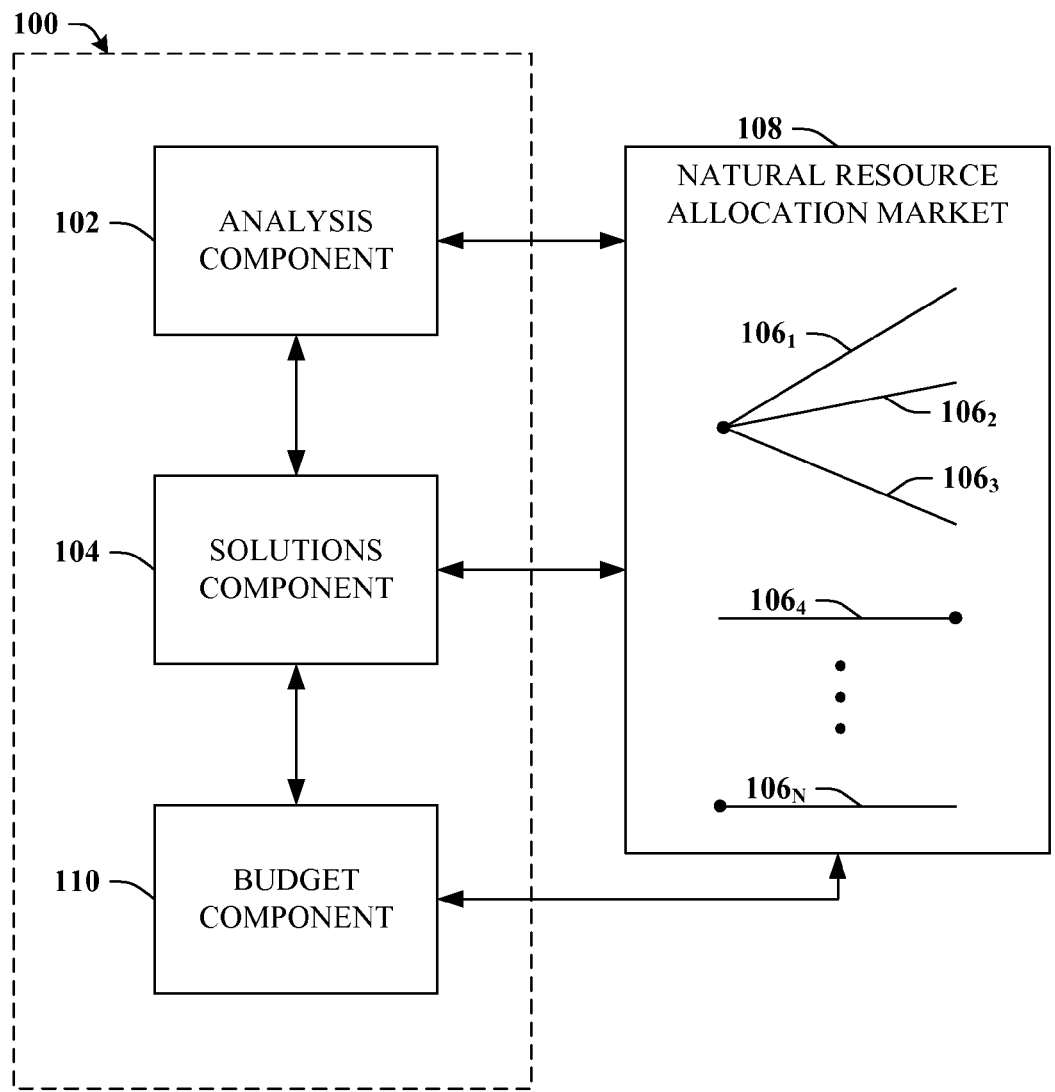
FIG. 1 is a block diagram that illustrates a computer implemented system that can facilitate equilibrium for a natural resource allocation market (NRAM).

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

As used in this application, the terms "component," "module," "system", "interface", "graph", "edge", "node", or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g. card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is if, X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As used herein, the terms to "infer" or "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Referring now to the drawing, with reference initially to FIG. 1, a computer implemented system 100 that can facilitate equilibrium for a natural resource allocation market (NRAM) is depicted. Generally, the system 100 can include an analysis component 102 that can ascertain at least one of a supply or a demand for a set of edges (e.g., edges $106_1$-$106_N$) in a NRAM 108. It is to be appreciated that edges $106_1$-$106_N$ can be referred to herein either individually or collectively as edge 106, even though each edge 106 can have characteristics that distinguish it from other edges 106. The edges 106 can relate to suppliers in a NRAM 108 that supply a good or service to buyers (e.g., sinks or nodes), wherein the buyers or suppliers can be defined as market participants or agents. As illustrated, edges 106 can be single-source, multiple sink (e.g., edges $106_1$-$106_3$) as well as other topologies such as a broadcast topology (not shown), which is further detailed infra.

In addition, the system 100 can also include a solutions component 104 that can employ a combinatorial algorithm in order to determine an equilibrium solution. Thus, in contrast to conventional systems, which are based upon employing inefficient convex programs (e.g., Eisenberg-Gale programs) in order to obtain the equilibrium solutions, the claimed subject matter can employ a combinatorial algorithm. In accordance with an aspect, the equilibrium solution (e.g., equilibrium between supply and demand) is an optimal solution to a convex program, yet the combinatorial algorithm can converge to the equilibrium solution in polynomial time. Both the solutions component 104 and the combinatorial algorithm are discussed in greater detain below.

Continuing with FIG. 1, the system 100 can also include a budget component 110 that can modify a price associated with utilization of an edge 106 from the set of edges $106_1$-$106_N$. For example, the budget component 110 can raise the price for utilizes an edge 106 (e.g., a particular supplier) when the demand for that edge 106 is greater than the supply for that particular edge 106. Additionally or alternatively, the budget component 110 can lower the price when the demand is less than the supply. It is to be appreciated that the budget component 110 can modify the price (e.g., raise or lower) by a predetermined amount. In other cases, the price can be modified by an amount that is dynamically inferred as will be described infra. In either case, whether the price is modified by a predetermined amount or by an amount dynamically inferred, the budget component 110 can modify the utilization price for multiple edges 106 by the same or a uniform amount. Moreover, the price modification can be performed on multiple edges 106 simultaneously. For instance, consider a subset of the set of edges 106, wherein the subset includes all edges 106 in which the demand exceeds the supply. The budget component 110 can uniformly raise the price for utilization of all members of the subset simultaneously.

In accordance with another aspect, strongly polynomial solutions can be applied to more concrete markets in the resource allocation framework such as modeling and understanding Transport Control Protocol (TCP) networks Resources in these markets can be edge capacities and agents want to build combinatorial objects such as source-sink flow paths or spanning trees or branchings, e.g. for establishing TCP connections or broadcasting messages to all nodes in the network. These can be referred to as capacity allocation markets.

In accordance therewith, the NRAM 108 can be a computer network environment, and an edge 106 from the set of edges can be a network path between a first and a second network participant or agent. Naturally, the supply can relate to bandwidth supply for the edge 106 and the demand can relate to the utilization demand for the edge 106. In this case, the budget component 110 can associate a positive price adjustment for traffic on congested edges 106 (e.g., where the demand or utilization outstrips the supply or available bandwidth). In some cases it can be assumed that there are many other edges 106 available to route the traffic in question. Accordingly, there is no need to use a congested edge 106 when others are available to satisfy the transaction.

In fact, in some instances, the supply can be thought of as infinite, even though for any given edge 106 at a given time there can exist congestion. Economically speaking, when the supply is infinite, the price will tend toward zero. Accordingly, in this example, it can be seen that edges 106 with a positive price for utilization are those that exhibit congestion. Thus, market forces will tend to alleviate this congestion and edges 106 will converge toward equilibrium. It is to be appreciated that equilibrium in certain cases can be thought of as equilibrium for the particular edge 106 in question, while in other cases for all (or a subset of) the edges 106 in the network 108.

In greater detail, the following description consists of two parts. In the first part, strongly polynomial algorithms are provided for abstract markets (e.g., NRAM 108) in which a submodular function specifies the maximum utility that can be derived by a set of agents (e.g., market participants such as buyers and suppliers, which can be represented as nodes). Submodularity is clearly natural restriction in this setting. We call these Submodular Utility Allocation (SUA) markets, for which specific examples of such markets can include Fisher's model (e.g., under the restriction that all buyer-good utilities are 0/1) and a single-source multiple-sink network market discussed in connection with FIG. 2.

As used herein in connection with a NRAM 108, the term "efficiency" is intended to be similar to the notion of "price of anarchy" given by Koutsoupias and Papadimitriou. In a sense, the claimed subject matter relates to the "price of capitalism" of a market. For example, in the presence of multiple agents who have different abilities to control the market and have their own idiosyncratic ways of utilizing the limited resources available, a question arises. How efficient is the market, in terms of overall output, once a pricing mechanism has forced it into an equilibrium? Hence, the efficiency of a market can be defined as the worst possible ratio of equilibrium utilities and the centralized optimum solution. It can be shown that SUA markets have efficiency 1, and, moreover, this characterizes such markets within the larger class of Uniform Utility Allocation (UUA) markets (described infra).

The term "fairness" can be defined as the notion of "bang per buck", e.g., utility received per unit money spent, of agents. For SUA markets we show that equilibria satisfy both max-min and min-max fairness with respect to bang per buck, moreover this characterizes such markets within the class of UUA markets. It is to be appreciated that max-min and min-max fairness are considered the strongest notions of fairness in game theory.

Markets satisfying the property of weak gross substitutability have been extensively studied, e.g. see Arrow and Hurwicz. Under this property, raising the price of one good does not decrease the demand for any other good. In our abstract markets, we have dispensed with goods and we are dealing directly with utility. In this context, another question arises: Is there a replacement for the fundamental property of weak gross substitutability in this setting?

For this purpose, the notion of "competition monotonicity" can be defined in the following manner: a market satisfies this condition if increasing the money of one agent cannot lead to an increase in the utility of any other agent. Observe that after the money of one agent is increased, the rest of the agents need to compete against a more powerful competitor. Hence competition monotonicity is a reasonable property to expect in a market. Below it is proved that any market in Fisher's setting which satisfies weak gross substitutability must also satisfy competition monotonicity. Using the disclosed algorithm for SUA markets, together with cross-monotonic cost allocations for submodular cost functions given by K. Jain and V. V. Vazirani, it can be shown that SUA markets satisfy competition monotonicity.

In the second part, markets can be considered in the resource allocation framework given by Kelly for modeling and understanding TCP congestion control. Resources in these markets can be edge capacities, and agents want to build combinatorial objects such as source-sink flow paths, spanning trees or branchings, e.g. for establishing TCP connections or broadcasting messages to all nodes in the network. Such markets can be referred to as "capacity allocation markets".

Figure 2:
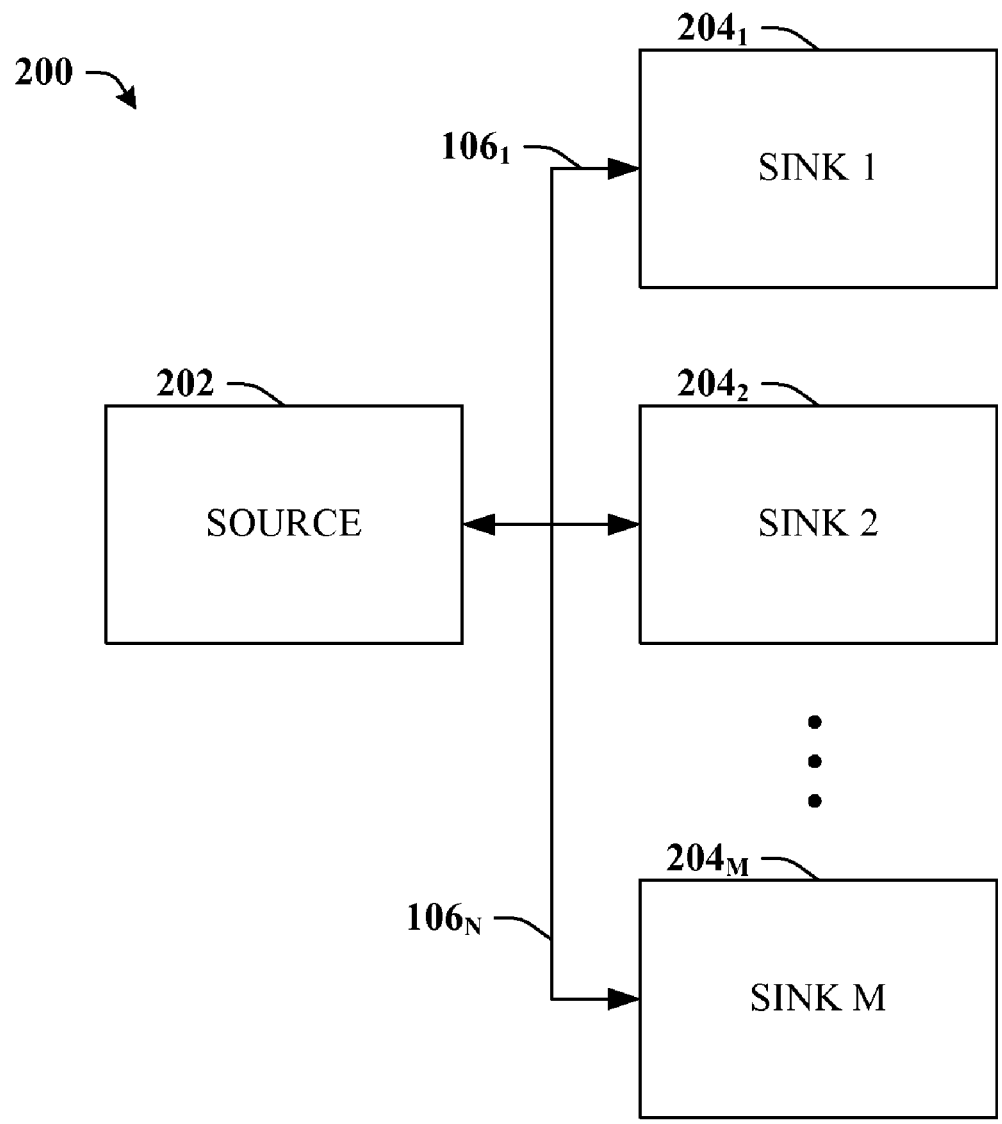
FIG. 2 illustrates an exemplary computer network comprising a single-source multiple-sink market.

Turning briefly to FIG. 2, an exemplary computer network 200 comprising a single-source multiple-sink network market is illustrated. In general, the network 200 can be a Wide-Area Network (WAN) such as the Internet as well as Local Area Network (LAN). The network 200 can include a source 202 that can be operatively coupled with one or more sinks $204_1$-$204_M$, the latter of which can be referred to herein either collectively or individually as sink 204. As depicted, the source 202 can be connected to the sinks by edges 106, which can be considered as sellers or suppliers. One purpose of FIG. 2 is to illustrate that the NRAM 108 from FIG. 1 can be a computer network environment, and, moreover, that an underlying mechanism for the claimed subject matter is the notion of modeling sellers as edges. In accordance therewith, an edge can be one of several network paths (e.g., suppliers) between a first (e.g., source) and a second (e.g., sink) network node. It should be underscored that the solutions component 104 of FIG. 1 can determine an equilibrium solution for either a point-to-point topology or a broadcast topology with respect to sources 202 and sinks 204.

A computer network provides a good illustration of a NRAM 108, since fairness is typically a central concern within TCP congestion control. For example, it is not acceptable that some users get all the bandwidth while other users' traffic is simply not routed. Kelly showed that all markets whose equilibria are captured by Eisenberg-Gale-type convex programs must satisfy proportional fairness, i.e., at equilibrium, the only way of increasing the utility of an agent by 5% is to decrease the utility of other agents by a total of at least 5%. This is a weaker notion of fairness than max-min fairness introduced supra.

The framework of UUA and SUA markets can be employed to understand and classify several natural capacity allocation markets. For the cases that turn out to be SUA markets, more efficient strongly polynomial algorithms can be provided by dispensing with the time-consuming oracle for minimizing a submodular function. All these markets typically inherit the properties of SUA markets mentioned above.

A setting of some significance within Kelly's framework is a network with link capacities specified and source-sink pairs of nodes, each with an initial endowment of money. In this case, Lagrangian variables corresponding to capacity constraints can be viewed as drop rates at links. Using KKT conditions, Kelly shows that at optimality, flow and drop rates must be in equilibrium: flow is only sent along paths supporting minimum drop rates and drop rates are positive only for links that are saturated. Continuous time algorithms (though not having polynomial running time), for solving this problem were given by Kelly, Maulloo, and Tan (see also Wang, Li, Low and Doyle for more recent work along these lines).

Meggido studied the single-source multiple-sink network from the viewpoint of fair allocations and showed that there is a max-flow which is max-min fair with respect to flows sent to the sinks. In the context of the disclosed fairness results, this can substantially correspond to the case that each sink has unit money. Meggido also showed that the function specifying the total flow possible to a subset of sinks is submodular. Therefore the corresponding market can be an SUA market.

More recently, Garg, et al. gave a strongly polynomial algorithm for the restriction of the single-source multiple-sink market to trees. This is already a fairly involved setting—it does not satisfy weak gross substitutability unlike all previous market equilibrium questions for which combinatorial algorithms have been found. The algorithm developed by Garg, et al. is fairly involved—it is a primal-dual algorithm that involves increasing and decreasing dual variables (prices on edges) much the way Edmonds' matching algorithm does. In view of these difficulties, had stated the open problem of extending their result to directed acyclic networks (see Example 22). In retrospect, our algorithm for arbitrary networks is much simpler than the one in Garg, et al.

While still referencing FIG. 2, but turning back to FIG. 1, in order to provide additional context, the following description is provided. The algorithm disclosed by N. Devanur, et al. for Fisher's linear case uses the spirit of the primal-dual schema, even though the underlying problem is not captured by a linear program. They ask the question of finding a mathematical framework in which their algorithm can be cast; the analogous framework for previous primal-dual algorithms being Linear Programming (LP)-duality theory. One answer to this question can be the framework of a "convex programming and KKT conditions." In accordance with an aspect, such can also be a starting point for the algorithms employed by the solutions component 104.

For example, the solutions component can use the primal-dual schema in this enhanced setting. The basic mechanism of ascending price auctions, which underlies some aspects of the disclosed algorithms, is responsible for their simplicity (and power). For instance, single-source multiple-sink networks can be viewed or modeled as an ascending price auction in which buyers are sinks 204 and sellers are edges 106. Since they have fixed budgets, as buyers continually increase their bids, their demands decreases. As soon as a minimum cut realizes that any more decrease in demand will leave it underutilized, it sells itself and fixes its price. All buyers, whose demand cannot be decreased without making this cut undersaturated, freeze their bids and demands; the remaining buyers keep increasing their bids. It can be appreciated that very few conceptual differences exist from a real auction situation and the modeled environment.

Several primal-dual algorithms for solving linear programs are best viewed as ascending price auctions. The solutions component 104, operating within the framework of a convex program and KKT conditions, can be fundamentally different in the following respects. Complementary slackness conditions of LP's are static in the sense that equations involve only primal variables or only dual variables. On the other hand, KKT conditions can be dynamic, e.g., they can involve both primal and dual variables. This difference can manifest itself as follows. In LP-based algorithms, buyers have fixed demands and are trying to minimize the price at which they buy; in the disclosed model, buyers have fixed budgets and they are trying to minimize the rate at which they buy and hence maximize the amount they buy.

In order to provide additional context for the claimed subject matter, a brief introduction and discussion of Fisher's model and the Eisenberg-Gale Program as well as Eisenberg-Gale markets.

Fisher's market equilibrium model can be explained in the following manner. Consider a market consisting of a set of n buyers (or agents), $A=\{1, 2 \ldots n\}$, and a set of k goods, B. Let $m_i \ldots m_n$ be the money possessed by the n buyers. It may be assume w.l.o.g. that there is a unit amount of each good. For $1<i<n$, let $u_i: R_+^k \rightarrow R_+$ be the function giving the utility derived by agent, i, in receiving an allocation of the k goods. Function $u_i$ can be assumed to be non-decreasing in each of its arguments. One one is to find prices $p_1 \ldots p_k$ for the goods so that when each buyer is given her optimal bundle of goods, the market clears, e.g. each good is exactly sold.

The linear case of Fisher's model is the following. Let $u_{ij}$ be the utility derived by buyer i on receiving one unit of good, j. The somewhat mild assumption can be made that for each good, j, there is a buyer, i, such that $u_{ij}>0$. Let $x_{ij}$ denote the amount of good, j, that buyer, i, gets. Then the total utility derived by i is:

$$u_i = \sum_{j=1}^{k} u_{ij} x_{ij}$$

Again, the problem is to find market clearing prices and allocations. Clearly, a convex program whose optimal solution is an equilibrium allocation must have as constraints the packing constraints on the $x_{ij}$ elements. Furthermore, the associated objective function, which attempts to maximize utilities derived, should satisfy the following: 1) If the utilities of any buyer are scaled by a constant, the optimal allocation remains unchanged; and 2) If the money of a buyer b is split among two new buyers whose utility functions are the same as that of b then sum of the optimal allocations of the new buyers should be an optimal allocation for b.

The money weighted geometric mean of buyers' utilities satisfies both these conditions:

$$\max\left(\prod_{i\in A} u_i^{m_i}\right)^{1/\Sigma_i m_i}$$

Clearly, the following objective function is equivalent:

$$\max \prod_{i\in A} u_i^{m_i}$$

The log can be used in the Eisenberg-Gale convex program as follows:

$$\text{maximize} \prod_{i\in A} m_i \log u_i \quad (1)$$

subject to the following constraints:

$$\forall i \in A: u_i = \sum_{j=1}^{n} u_{ij} x_{ij}$$

$$\forall j \in B: \sum_{i\in A} x_{ij} \leq 1$$

$$\forall i \in A, j \in B: x_{ij} \geq 0$$

Interprete Lagrangian variables, say, $p_j$'s corresponding to the second set of conditions as prices for goods. Using KKT conditions one can show that optimal solutions to $x_{ij}$'s and $p_j$'s give an equilibrium for Fisher's problem. Using the fact that the objective function of this convex program is strictly concave, it is easy to show that the utility derived by each buyer is the same in all equilibrium allocations and the equilibrium prices are unique.

Over the years, convex programs with the same basic structure as the Eisenberg-Gale program were found for more general models such as scalable utilities, Leontief utilities, homothetic utilities with productions and the resource allocation framework of Kelly. These convex programs differ only in the way they capture the set of feasible utility vectors. Accordingly, a market model that generalizes all these models can be defined.

Consider a market M in Fisher's model whose set of feasible allocations and buyers' utilities is captured by a polytope, P. The linear constraints defining P can include two types of variables, utility variables or allocation variables. The index, i, can be used to vary over variables and index j to vary over constraints. It can be further assumed w.l.o.g. that the first n variables represent buyers' utilities and the rest represent allocations. Another assumption can be that the linear constraints describing P are written in normal form as $\Sigma_i a_{ij} x_i \leq b_j$.

It can also be assumed that market M satisfies the "free disposal" property, e.g. whenever u is a feasible utility vector then vector dominated by u is also a feasible utility vector. As a result, for each constraint, j, for all $i \leq n$, $a_{ij} > 0$. A further assumption can be that M satisfies "utility homogeneity", e.g. for each constraint, j, if for some $i < n$, $a_{ij} > 0$, then $b_j = 0$. Such a market can be referred to as an Eisenberg-Gale market, or "EG" market.

It has been demonstrated that under the conditions stated above, the equilibrium for market, M, maximizes the money weighted product of buyers' utilities, and can be therefore captured by way of an Eisenberg-Gale-type program. Sometimes the given utility functions may not satisfy all these conditions; however, one can obtain "equivalent" utility functions that do so. For example, how to transform homothetic, quasi-concave utilities to this form has also been demonstrated. Since the equilibrium of an EG market is captured by way of a convex program, equilibrium utilities can be approximated to any required degree in polynomial time (though not strongly polynomial time) using the ellipsoid algorithm.

Remark 1: Observe that even if the number of constraints defining M. are not finite in number, the equilibrium could still be captured via an Eisenberg-Gale-type convex program. We have restricted ourselves to finitely many constraints for the sake of simplicity.

A basic difference between the Arrow-Debreu model and Fisher's model is that whereas in the former initial endowments and actual allocations play an important role, in the latter, only the utilities derived by buyers are important, the actual allocations made to buyers is not. This is reflected in the Eisenberg-Gale program in which only the utility variables occur in the objective function.

In order to simplify the picture, let us project polytope, P, onto the utility variables to get polytope, $P_u$. Assume that the constraints of $P_u$ are written in the following form:

$$\forall q: \sum_{p} c_{pq} u_p \leq d_q,$$

where $u_p$ is buyer utility, p and index, q, varies over the constraints. Because of the free disposal assumption, $c_{pq} \geq 0$, and because utilities are nonnegative, $d_q \geq 0$. These constraints can define the Eisenberg-Gale-type convex program for this market.

In such an abstract market, there are no goods. However, one may view each constraint, q, as defining an abstract good which is desired by only the buyers having non-zero coefficients in this constraint. A set of linear constraints representing $P_u$ can be obtained using, e.g., the Fourier-Motzkin elimination method. Therefore, the constraints describing $P_u$ are linear combinations of the constraints used for describing P. Hence the dual variables of the abstract market (which correspond to constraints of $P_u$) are the same linear combination of the dual variables of the concrete market (which correspond to the constraints of P). This shows how to transform prices from the abstract market to the concrete market. Abstracting in the reverse direction is a straightforward process. The simplicity of the abstract markets helps uncover many structural properties.

With the foregoing in mind, UUA and SUA markets in accordance with the claimed subject matter can be described in more detail. Assume that an abstract market is defined by packing constraints of the form:

$$\forall j: \sum_i a_{ij} u_i \leq b_j$$

$$\forall i \in A: u_i \geq 0$$

where $a_{ij}$'s and are constants satisfying $a_{ij} \geq 0$ and $b_j > 0$. In these constraints, $b_j$'s encode the supply of resources, and for a fixed, j, the different $a_{ij}$'s encode the different ways in which agents use resources. Let us consider the special case in which for each j, all agents interested in this resource use it in the same way, e.g., all $a_{ij}$'s are restricted to be 0/1. Clearly, there can be at most $2^n$ such relevant constraints. The $b_j$'s for these constraints can be encoded by way of a function $v: 2^A \to R_+$, and the constraints can then be written as:

$$\forall S \subseteq A: \sum_{i \in S} u_i \leq v(S)$$

$$\forall i \in A: u_i \geq 0.$$

Accordingly, a utility vector, u, can be feasible for v if it satisfies all these constraints. For set $S \subset A$, then u can make S "tight" if $\Sigma_{i \in S} u_i \leq v(S)$. Let us define the "covering closure", $v^*$, of v as follows. For $S \subset A$, define $v^*(S)$ to be the minimum cost fractional covering of S, e.g., the solution to the following linear program.

$$\min \sum_{T \in A} v(T) x_T$$

$$\forall i \in S: \sum_{T: i \in T} x_T \geq 1$$

$$\forall T \in A: x_T \geq 0.$$

A function whose covering closure is itself (e.g. $v^*$) can be said to satisfy the "covering property". Clearly, such a function must satisfy "monotonicity", e.g., $\forall S \subset T: v^*(S) \leq v^*(T)$. Clearly, a utility vector, u, is feasible for v if and only if it is feasible for $v^*$. Therefore, one can assume w.l.o.g. that function $v: A \to R_+$ satisfies the covering property, monotonicity and the fact that $v(\emptyset) = 0$.

Given such a function, v, let us define a market $M(v)$ as follows. An "instance" of $M(v)$ can be specified by specifying the money possessed by each agent. Let $m_i$ be the money possessed by each agent, i, under an instance I. One object is to find utilities of agents, u, and prices p's for each subset $S \subset A$ such that:

1. $\forall S \subseteq A: p_s \geq 0$
2. $\forall S \subseteq A: p_s \geq 0 \Rightarrow u$ makes $S$ tight
3. $\forall i \in A: \dfrac{m_i}{u} = \text{rate}(i)$ where for $i \in A$, rate(i) can be defined to be the sum of prices of all sets containing i, e.g., $$\text{rate}(i) = \sum_{S: i \in S} p_s$$

This can be the rate at which agent i gets one unit of utility. The traditional notion of bang per buck of agent i can be the reciprocal of rate(i); it is the number of units of utility that i derives per unit of money. Thus, the bang per buck of agent i can be $u_i/m_i$.

Such a market can be referred to as a UUA market. An example of a UUA market can be Fisher's model under the restriction that all $u_{ij}$'s are 0/1. Consider the following convex program corresponding to instance I of market $M(v)$.

$$\text{maximize} \sum_{i \in A} m_i \log u_i \qquad (2)$$

$$\text{subject to} \quad \forall S \subseteq A: \sum_{i \in S} u_i \leq v(S)$$

$$\forall i \in A: u_i \geq 0.$$

Let $p_S$, $S \subset A$ be Lagrangian variables corresponding to the first set of conditions. As in the case of the Eisenberg-Gale program, using KKT conditions, one can show that optimal solutions to u and p must give equilibrium utilities and prices for the market.

Function v is said to be a "submodular function" if:

$$v(S) + v(T) \geq v(S \cup T) + V(S \cap T),$$

for any sets $S, T \subset A$. Hence, it is straightforward to see that a submodular function satisfies the covering property. Function v is said to be a "monotone" if $v(S) \geq v(T)$ for $S \subset T \subset A$.

A noteworthy case arises when v is a "polymatriod function", e.g. it is submodular, monotone, and $v(\emptyset) = 0$. In such a case $M(v)$ can be said to be a SUA market. Fisher's model under the restriction that all $u_{ij}$'s are 0/1 can be an example of such a market.

Given the above, further detail can be provided with respect to efficiency, fairness, and competition monotonicity. In particular, Let $M(v)$ be a UUA market and let I be an instance of this market. Under I, let the money of agent i be $m_i$. Further, let $M(I)$ denote the set of agents having positive money in instance I, e.g. $M(I) = \{i \in A | m_i > 0\}$. Assume $|M(I)| = n$ and that $M(I) = \{1, \ldots, n\}$.

Since v is a covering function, by the Bondareva-Shapley Theorem, there is a utility vector that is feasible for v and it makes set $M(I)$ tight, e.g. the total utility derived by agents having money is $v(M(I))$. Denote by $u(I) = u + \ldots + u_n$ the total utility derived by agents in $M(I)$ at the equilibrium utility vector, u. The efficiency of this market can be defined as:

$$\text{efficiency}(M(v)) = \min_I \frac{u(I)}{v(M(I))},$$

where the minimum is over all instances of $M(v)$.

Let q and r be n-dimensional vectors with nonnegative coordinates. We will denote by $q_{DEC}$ the vector obtained by sorting the components of q in decreasing order, and will say that q "min-max dominates" r if $q_{DEC}$ is lexicographically smaller than $q_{DEC}$, e.g., if there is an i such that $q_{DEC}(i) < r_{DEC}(i)$ and $q_{DEC}(j) = r_{DEC}(j)$ for $j < i$. Clearly, $q_{DEC} = r_{DEC}$ may hold even though $q \neq r$.

Similarly, we will denote by $q_{INC}$ the vector obtained by sorting the components of q in increasing order, and will say that q "max-min dominates" r if $q_{INC}$ is lexicographically larger than $r_{INC}$, e.g., if there is an i such that $q_{INC}(i) > r_{INC}(i)$ and $q_{INC}(j) = r_{INC}(j)$ for $j < i$.

The core(I) can be defined to be the set of functions f: $A \rightarrow R_+$ such that f is feasible for v and f makes M(I) tight f core(I) can be said to be "min-max fair" if $(f_1/m_1, \ldots, f_n/m_n)$ min-max dominates $(g_1/m_1, \ldots, g_n/m_n)$ for all functions $g \in$ core(I). Observe that here we are comparing the bang per buck of agents. Similarly, f can be said to be "max-min fair" if $(f_1/m_1, \ldots, f_n/m_n)$ max-min dominates $(g_1/m_1, \ldots, g_n/m_n)$ for all functions $\in$ core(I).

Next the notion of "competition monotonicity" can be defined for a market M. Let I be an instance of M with agents i, j having money $m_i$ and $m_j$, respectively. Obtain instance I' by increasing the money of agent i from $m_i$ to $m'_i$, $m'_i > m_i$ and keeping the money of the rest of the agents unchanged. Let u and u' be the equilibrium utility vectors for the two instances. We will say that market M possesses the property of competition monotonicity if for any two such instances, I and I', $u'(j) < u(j)$, e.g. on increasing the money of i the utility of agent j cannot increase.

The following is a well-known fact. Let M be a Fisher market satisfying weak gross substitutability. Suppose at prices p the total demand for each good is at least as large as the supply. Then, the equilibrium price vector must dominate e.g., the equilibrium price of each good j must be at least $p_j$.

Theorem 2: Let M be a Fisher market satisfying weak gross substitutability. Then M satisfies competition monotonicity.

Proof: Let I be an instance of M, with each agent j having money $m_j$. Let p and u be equilibrium prices and utilities. Now, assume the money of agent i is increased to $m'_i$, keeping the money of the rest of the agents unchanged. At prices p, the demand of agent i for each good can only go up and the demands of the rest of the agents remains unchanged. Therefore, by the fact stated above, the new equilibrium prices will dominate p. Therefore, the allocations, and hence utilities, for each of the other agents cannot increase.

Below, a combinatorial strongly polynomial time algorithm for finding an equilibrium for an SUA market will be provided below. As a corollary this will imply that the convex program corresponding to such a market always has rational solutions if all input parameters are rational. This algorithm can also help establish one direction for each of the following two basic theorems characterizing SUA markets; it also helps prove Theorem 19, infra. The proof of the other direction of Theorem 3 requires real analysis and that of Theorem 4 requires notions from a paper by K. Jain.

Theorem 3: A uniform utility allocation market has efficiency 1 if and only if it is a submodular utility allocation market.

Theorem 4: A uniform utility allocation market is max-min fair (min-max fair) if and only if it is a submodular utility allocation market.

Next, an algorithm for SUA markets can be supplied. For example, Let M(v) be an SUA market. First, the submodularity of v can be employed to define a canonical dual solution. One may assume w.l.o.g. that under instance I, M(I)=A, e.g., all agents have positive money.

Two sets $S \subset A$ are said to be "uncrossed" if they are either disjoint or one is contained in the other. If S, T are not uncrossed, they are said to be "crossing sets". Let u be feasible for v. Thus, using the submodularity of v it is easy to see that if S and T are tight then so are $S \cup T$ and $S \cap T$. Now, by standard uncrossing arguments one can show:

Lemma 5: For any instance of market M(v), equilibrium prices can be chosen in such a way that sets having positive prices form a nested family.

As stated in the supra, the disclosed algorithm is best viewed as an ascending price auction. Agents keep raising their bids (rates). When a set realizes that any more increase will leave it under-saturated, it declares itself sold and fixes its price, and agents whose bids cannot be increased any more freeze their bids and demands.

The solutions component 104 can initialize prices of all sets to zero and the rates of all agents to zero. The solutions component 104 can iteratively finds a nested family of sets, $A=A_1 \supset A_2 \supset \ldots \supset A_k \supset A_{k+1}=\emptyset$ and can compute their respective prices. In the first iteration, the solutions component 104 can compute the price of A as well as find the next set $A_2$. In general, at iteration j, the solutions component 104 can compute the price of $A_j$ and find the next set, $A_{j+1}$. Clearly, the rates of all agents in $A_j - A_{j+1}$ can be the same.

Consider iterations j, $1 \leq j \leq k$. Let $p_1, \ldots, p_{j-1}$ be the prices assigned to sets $A_1, \ldots, A_{j-1}$ so far. Let $r=p_1 + \ldots + P_{j-1} + p$, where p is a variable whose value will be found in the current iteration. It will eventually be the price of $A_j$. Price p can be initialized to zero and can be raised uniformly as described below; as p increases, r also typically increases.

Define function h: $2^{A_j} \rightarrow R_+$ as follows:

$$h(S) = v(S) + \frac{m(A_j - S)}{r}$$

where $S \subset Ai$. For $S \subset A_j$, we will say that S is "active" if $h(S)=v(\overline{A_j})$. Due to the fact that in the previous iteration a minimal active set can be found, at the beginning of the current iteration, when p=0, for each $S \subseteq A_j$, $h(S) > v(A_j)$.

In iteration j, p can be raised uniformly until some set becomes active. Observe that this condition must eventually be satisfied, since $S=\emptyset$ is also being considered. It can be demonstrated how to find the correct value of p, say p*, at which a set can become active. Using the submodularity of v we show in Lemma 7 that the minimal active set is unique. For instance, let $S \subset A_j$ be such a set. The price of $A_j$ can be set to p*, e.g. $p_j = p*$. Also, for all agents $i \in A_j - S$, rate(i) can be set to $p_1 + \ldots + P_{j-1} + P_j$. If $S = \emptyset$, the algorithm can halt. Otherwise, the solutions component 104 can set $A_{j+1}$ to S and continue to the next iteration. The algorithm is summarized infra.

---

Algorithm 6 (Algorithm for an SUA Market)

1. $T \leftarrow A$
2. $r \leftarrow 0$
3. While $T \neq \emptyset$ do
   $p \leftarrow 0$
   Raise p uniformly until a set becomes active. Let $S \subset T$ be a minimal active set.
   $pr \leftarrow p$
   $r \leftarrow r + p$
   $\forall i \in T - S$; rate(i) $\leftarrow$ r.
   $T \leftarrow S$
4. $\forall i \in A$ ; $u_i \leftarrow m_i$/rate(i).

---

Submodularity of v easily can imply that the intersection of two active sets must be active. Therefore we get:

Lemma 7: The minimal active set is unique.

Lemma 8: The utilities and prices computed by Algorithm 6 satisfy all KKT conditions.

In order to find the next active set, let T be the current set being computed by the solutions component 104. As above, define function h: $2^T \to R_+$ as follows:

$$h(S) = v(S) + \frac{m(T-S)}{p'+p},$$

where $S \subset T$, p' is the sum of prices of all sets found so far by the solutions component 104 and p is the variable giving the price of T.

As before, for $S \subset T$, we will say that S is "active" if h(S)=v(T). As stated above, at the beginning of the iteration when p=0, for each $S \subset A_i$, h(S)>v(T) and, hence, no set is active. Let p* be the smallest value of p at which a set becomes active and let S* be the minimal active set; by Lemma 7 S* is unique.

For $S \subset T$ define price(S) to be the value of p obtained by solving the equation h(S)=v(T). Clearly, price(S)≧p*. For p>0, let set(p) be the minimal set minimizing v(S)+m(T−S)/(p'+p); by a proof similar to Lemma 7 set(p) is unique.

The procedure given below finds p* and S*.

---
Algorithm 9 (Subroutine for finding p* and S*)

1. S ← ∅
2. p ← price(∅)
3. While set(p) ≠ S do
    S ← set(p)
    p ← price(S)
4. Output S,p
---

Lemma 10 Let p>p*: set(p)=S, price(S)=q and set(q)=R. Then q<p and R ⊃ S.

Corollary 11: Subroutine 9 terminates with p* and S* in at most |T| calls to a submodular function minimization oracle.

Strongly polynomial algorithms for the minimization of a submodular function are already known. Since Algorithm 6 finds a nested family of sets, it executes at most n iterations. Now by Lemma 8 and Corollary 11 we get:

Theorem 12: Algorithm 6 computes a market equilibrium for the given submodular utility allocation market in strongly polynomial time.

One can also examine efficiency of SUA markets. In one direction of theorem 12, that a SUA market has efficiency 1, follows directly from the fact that the equilibrium found by Algorithm 6 makes set A=M(I) tight.

For the other direction, consider a UUA market M(v) which is defined via function v: $A \to R_+$ that satisfies the covering property but is not submodular. Let S be a smallest sized set for which submodularity is violated, e.g. there exist i,j ∉ S such that:

$v(S \cup \{i\}) + v(S \cup \{j\}) < v(S) + v(S \cup \{i,j\}).$

Let $v(S \cup \{i,j\}) = v(S \cup \{i\}) + v(S \cup \{j\}) - v(S) + \delta,$ where δ>0. Since v satisfies the covering property it is easy to see that S≠∅.

We wish to construct an instance I of this market such that M(I)=S ∪ {i, j}, yet the equilibrium utility vector does not tighten the set S ∪ {i,j}. One way to ensure the latter condition is to ensure that, at equilibrium, set S is tight. For example, since the equilibrium is feasible for S ∪ {i} and S ∪ {i}, S ∪ {i,j} cannot be tight. However, it is easy to construct function v such that S is tight only when i and j do not have any money, e.g. let v(S ∪ {i})=v(S ∪ {j})=v{S}, and v (S ∪ {i,j})=v(S)+1.

This difficulty can be circumvented essentially by showing an instance for which S is almost tight. Then v(S ∪ {i,j}) will not be tight as shown in Lemma 13. Suppose all agents in S have unit money, and i and j have no money. Since v is submodular over S, S will be tight at equilibrium. Now, if we could show continuity of the total equilibrium utility of S as the money of i and j is in the neighborhood of zero, we would be finished.

Lemma 13: Let g be a feasible utility allocation for v such that g(S)>v(S)−δ. Then g cannot tighten S ∪ {i, j}.

Lemma 14: There is a feasible vector, h, for v such that h(i)=h(j)=0, for l ∈ S, h{l}≧g{l}, and $$\sum_{l \in S} h(l) = v(S).$$

Lemma 15: g(S)>v(S)−δ.

Lemma 16: The equilibrium for a submodular utility allocation market is min-max fair and max-min fair.

Lemma 17: If v is not submodular then the equilibrium for the corresponding market M(v) is neither max-min fair nor min-max fair.

Lemma 18: g is feasible for S ∪ {i, j}.

Theorem 19: Submodular utility allocation markets satisfy competition monotonicity.

Example 20: An example of a UUA market is now provided which is not an SUA market for which competition monotonicity does not hold. The market consists of three agents i, j, and k. Define function v as follows: v(i)=v(j)=v(k)=2, v(i, j)=v(j, k)=v(k, i)=2; and v(i, j, k)=3. Let i, j, k have money 1, 2, 5, respectively. Then one can check that equilibrium utilities are 3/4, 3/4, 5/4, respectively. When the money of i is raised to 2, equilibrium utilities are 8/9, 8/9, 10/9. Observe that the utility for j has increased.

Next, a discussion of capacity allocation markets is provided. Kelly considered the following general setup for modeling resource allocation: Let R be a set of resources and c: $R \to Z^+$ be the function specifying the available capacity of each resource r ∈ R. Let A={$a_1, \ldots, a_n$} be a set of agents and $m_i \in Z^+$ be the money available with agent $a_i$.

Each agent wants to build as many "objects" as possible using resources in R. An agent may be able to use several different subsets of R to make one object. Let $S_{i1}, S_{i2}, \ldots, S_{ik}$ be subsets of R usable by agent $a_i$, $k_i \in Z^+$. Denote by $x_{ij}$ the number of objects $a_i$ makes using the subset $S_{ij}$, $1 \le j \ge k_i$; and $x_{ij}$ is not required to be integral. Let $$f_i = \sum_{j=1}^{k_i} x_{ij}$$

be the total number of objects made by agent $a_i$. It can be said that $f_i$, $1 \le i \le n$ is "feasible" if simultaneously each agent $a_i$ can make $f_i$ objects without violating capacity constraints on R.

Kelly considered the following convex program and showed that an optimal solution to it satisfies "proportional fairness", e.g., if $f_i^*$ is an optimal solution and $f_i$ is any feasible solution, then:

$$\sum_{i=1}^{n} \frac{f_i - f_i^*}{f_i^*} \leq 0.$$

Intuitively, the only way of making an agent happier by 5% is to make other agents unhappy by at least a total of 5%.

$$\text{maximize} \sum_{a_i \in A} m_i \log f_i \quad (3)$$

$$\text{subject to } \forall\, a_i \in A : f_i = \sum_{j=1}^{k_i} x_{ij}$$

$$\forall\, r \in R: \sum_{(ij): r \in S_{ij}} x_{ij} \leq c(r)$$

$$\forall\, a_i \in A, 1 \leq j \leq k_i : x_{ij} \geq 0.$$

This general setup can be used to model many situations. The following 4 market scenarios will be considered:

Market 1: Given a directed graph G=(V,E), E is the set of resources, with capacities specified. Agents are source-sink pairs of nodes, $(s_1, t_1), \ldots, (s_k, t_k)$, with money $m_1, \ldots, m_k$, respectively. Each $S_i$–$t_i$ path is an object for agent $(s_i, t_i)$.

Market 2: Same as Market 1 above, except the graph is undirected.

Market 3: Given a directed graph G=(V, E), E is the set of resources, with capacities specified. Agents are A ⊂ V, each with specified money. For s ∈ A, objects are branchings rooted at s and spanning all V.

Market 4: Same as above, except the graph is undirected and objects are spanning trees.

Using KKT conditions, one can show that an optimal solution to this convex program is an equilibrium solution. Let $p_r$, $r \in R$ be Lagrangian variables corresponding to the second set of conditions, which can be interpreted as prices of resources. By the KKT conditions, optimal solutions to $x_{ij}$'s and $p_r$'s must satisfy the following 4 constraints:

$$\forall\, r \in R: p_r \geq 0$$

$$\forall\, r \in R: p_r > 0 \Rightarrow \sum_{(ij): r \in S_{ij}} x_{ij} = c(r)$$

$$\forall\, a_i \in A, 1 \leq j \leq k_i : \frac{m_i}{f_i} \leq \sum_{r \in S_{ij}} p_r$$

$$\forall\, a_i \in A, 1 \leq j \leq k_i : x_{ij} > 0 \Rightarrow \frac{m_i}{f_i} \leq \sum_{r \in S_{ij}} p_r$$

From these conditions, one can derive that an optimal solution to convex program (3) must satisfy the following equilibrium conditions:

(1) Resource $r \in R$ has positive price only if it is used to capacity.
(2) Each agent uses only the cheapest sets to make objects.
(3) The money of each agent is fully used up.

The model given above does not capture the linear case of Fisher's market equilibrium problem as a special case; however, a further generalization does: For agent $a_i$, we are specified utilities, $u_{ij}$, $1 \leq j \leq k_i$, which give the utility derived by $a_i$ if it uses set $S_{ij}$ to make its objects. The total utility derived by $a_i$ is $$f_i = \sum_{j=1}^{k_o} u_{ij} x_{ij}.$$

The linear case of Fisher's market equilibrium problem is now a special case: each buyer i is interested in singleton subsets of goods and derives utility $u_{ij}$ on obtaining one unit of good j.

Since the objective function of convex program (3) can be strictly concave, one can see that at optimality, the vector $f_1, \ldots, f_n$ is unique. Clearly, this also holds for every equilibrium allocation. Let M denote a capacity allocation market. For instance I of M let f(I) denote the total number of objects made by the agents in an equilibrium allocation; clearly, $f(I) = f_1 + \ldots + f_n$, where $f_1, \ldots, f_n$ is the unique vector optimizing convex program (3). Denote by F(I) the maximum number of objects that can be made in a feasible allocation of resources, and define $$\text{efficiency}(M) = \min_{I \in M} \frac{f(I)}{F(I)}$$

Remark 21: For the purpose of studying efficiency of markets in which equilibrium output is not unique, one will have to define two notions: ratio of worst/best equilibrium to centrally optimal solution, analogous to the notions of price of anarchy and price of stability.

For single-source multiple-sink markets, one can consider the special case of Market 1 with a single source and multiple sinks. As stated supra, this can be a SUA market. Therefore, the solutions component 104 can employ algorithm (6) to compute the equilibrium for it in strongly polynomial time. However, a more efficient algorithm can be derived. The identical case for Market 2 reduces to Market 1 using the standard reduction from undirected graphs to directed graphs, e.g., replace each undirected edge with two bi-directed edges of the same capacity.

More formally, let G=(V, E) be a directed graph with capacities on edges. Let s ∈ V be the source node and T={$t_1, \ldots, t_r$} be the set of sink nodes, also called terminals. Let $m_i$ be the money possessed by sink $t_i$. For any assignment of prices to the edges of G, we will denote by rate($t_i$) the cost of the cheapest s–$t_i$ path in G. As mentioned above, obtaining an algorithm for computing equilibrium prices and flows for acyclic graphs was left as an open problem in Garg, et al. The example given below illustrates why this is a non-trivial problem.

Example 22: Consider graph G=(V, E) with V={s, a, b, c, d} and sinks b and d with $120 and $10, respectively. The edges are: (s,a), (s,c) having capacity 2, (a, b) having capacity 1, and (a, d), (c, d), (c, b) having capacity 10. The unique equilibrium prices are $p_{(s,a)}$=$10, $p_{(a,b)}$=$30, $p_{(s,c)}$=$40, and the rest of the edges have a zero price. At equilibrium, flow on path s, a; d is one and b is one On path s, c; b is two. Simulating the algorithm below on this example will reveal the complex sequence of cuts it needs to find in order to compute the equilibrium.

With the foregoing in mind, a high level description of an algorithm employed in accordance with an aspect of the claimed subject matter can be provided. Since the objective function of Eisenberg-Gale-type convex programs (1) and (3) is strictly convex, it is easy to see that at optimality, the vectors of utilities, $u_i$'s, or of total flows to sinks, $f_i$'s, are unique. For our problem, this means that at equilibrium, rate($t_i$) is uniquely determined for each sink $t_i$. It is a simple matter to construct examples to show that prices of edges are not uniquely determined at equilibrium.

Indeed, in considering the disclosed algorithms, the variables rate($t_i$) can be fundamental variables and prices of edges can be auxiliary variables. The former variables can be introduced by adding in a new sink node t and edges ($t_i$, t) which can be referred to as "dummy edges". All rates can start at zero, and at this point each sink demands an infinite amount of flow. Clearly, each cut is oversaturated. All rates increase at unit rate with time, consequently, demands keep decreasing. As soon as a minimum cut realizes that it is about to become under-saturated, it can freeze the rates and demands of all culprit sinks. It can also declares itself sold and fix its price. The rest of the sinks keep increasing their rates and so on. When the demands of all sinks are frozen, the solutions component can terminate the algorithm.

The solutions component 104 can initialize prices of all edges to zero and iteratively raises prices of edges in specific cuts until equilibrium prices are found. At any point in the algorithm, let rate($t_i$) denote the cost of the cheapest s–$t_i$ path in G with respect to current prices. Introduce a new sink node t and edges ($t_i$, t) from each of the original sinks to t, which can be dummy edges. At any point in the algorithm, the capacity of edge ($t_i$, t) can be $m_i$/rate($t_i$). Hence, initially this edge will have infinite capacity and as prices of edges are raised, and consequently rate($t_i$) increases, the capacity of this edge will keep decreasing. Let G' denote the graph with t and dummy edges included. For simplicity of notation, we will not rename this graph as the capacities of dummy edges are decreasing.

Iteration zero can be executed as follows: Find a maximal minimum s–t cut, say ($S_0$, $\overline{S_0}$) in G'. Clearly, T ⊂ $\overline{S_0}$. Therefore, all edges in this cut are edges of G. Let $c_0$ denote the set of edges in this cut. Start raising the prices of edges in $c_0$ uniformly. As a consequence, capacities of all dummy edges will keep decreasing. Stop when a new maximal minimum s–t cut, say ($S_1$, $\overline{S_1}$), appears. Below, a strongly polynomial algorithm for finding this cut is provided. In accordance with Lemma 23 it can be shown that $S_0$ ⊂ $S_1$. Let $T_1$ be the set of terminals in $S_1$–$S_0$, $c_1$ be the set of edges of G (e.g., not including the edges incident at t) in the cut ($S_1$, $\overline{S_1}$), and $p_0$ be the prices assigned to edges in $c_0$.

The first iteration can be executed as follows: Start raising the prices of all edges in $c_1$ uniformly. Clearly, the rate for each sink in $T_1$ remains frozen at $p_0$ and, as shown in Lemma 24, the rate for each sink in T–$T_1$ is $p_0$+p, where p is the current price of edges in $c_1$. Stop when a new maximal minimum s–t cut, say ($S_2$, $\overline{S_2}$), appears. Again, let $c_2$ be the set of edges of G in the cut ($S_2$, $\overline{S_2}$).

In general, in the i-th iteration, the solutions component 104 can raise the price of edges in $c_i$ until a new maximal minimum s–t cut, say ($S_{i+1}$, $\overline{S_{i+1}}$), appears. By Lemma 23, $S_i$ ⊂ $S_{i+1}$. If this cut is (V, t), the solutions component 104 can terminate the algorithm. Otherwise, the algorithm can proceed to the next iteration.

Suppose the solutions component 104 executes k+1 iterations. In the process, it finds sets $S_0$ ⊂ $S_i$ ⊂ ... ⊂ $S_k$. Let $T_i$ be the set of terminals in $S_i$–$S_{i-1}$, for $1 \leq i \leq k$, and let $T_{k+1}$ be the set of terminals in $S_k$. Let $c_i$ be the set of edges of G in the cut ($S_i$, $\overline{S_i}$), for $0 \leq i \leq k$ and $p_i$ be the price assigned to edges in $c_i$.

Lemma 23: $S_0$ ⊂ $S_i$ ⊂ ... ⊂ $S_k$.

Lemma 24: During the i-th iteration, each terminal t ∈ (T–$S_i$) has rate(t)=$p_0$+ ... +$p_{i-1}$+p, where p is the current price of edges in the cut $c_i$, for $0 \leq i \leq k$.

Lemma 25: For each terminal t' ∈ T, rate(t')=$p_0$+ ... + $p_{i-1}$, for $1 \leq i \leq k+1$.

Lemma 26: Each of the cuts $c_0$, $c_1$, ... $c_k$ is saturated by f.

Lemma 27: Flow f sends flow to each sink along the cheapest paths and moreover the money of each sink is fully spent by flow f.

Theorem 28: The algorithm given above finds an equilibrium allocation in $O(r^2)$ max-flow computations, where r is the number of sinks.

Let G' be the graph defined above. Let (S,), S ⊂ V be the maximal s–t min cut in G', let c be the set of edges in the cut (S, $\overline{S}$), let and f be its capacity. For each sink t' ∈ $\overline{S}$, define the capacity of edge (t',t) to be m/($p_0$+p) where $p_0$ is the sum of prices assigned to all cuts found so far in the algorithm (this is a constant for the purposes of this subroutine), and p is the price assigned to edges in c. For any cut C, let $cap_p$(C) denote its capacity, assuming the prices of edges in c is p. Let p* be the smallest value of p at which a new s–t min-cut appears in G'. Further let (U, $\overline{U}$), U ⊂ V be the maximal such mincut. Below a strongly polynomial algorithm to find p* and (U, U) is given.

For p>0, define cut(p) to be the maximal s–t min-cut in G' assuming that the price assigned to edges in c is p. For cut (A, $\overline{A}$), A ⊂ V, let price(A, $\overline{A}$) denote the smallest price that needs to be assigned to edges in c to ensure that $cap_p$(A, $\overline{A}$)=f, e.g., (A, $\overline{A}$) is also a min s–t cut in G'; if (A, $\overline{A}$) cannot be made a min s–t cut for any price p then price(A, $\overline{A}$)=∞. Clearly, price(A, $\overline{A}$)≧p*. Observe that it is easy to determine price(A, $\overline{A}$).

---

Algorithm 29 (Subroutine)

1. C ← (V,t)
2. p ← price(C)
3. While cut(p) ≠ C do
    C ← cut(p)
    p ← price(C)
4. Output (C,p)

---

The following lemma is related to Lemma 10.

Lemma 30: Suppose p>p*. Let cut(p)=(A, $\overline{A}$), where A≠U. Let price(A, $\overline{A}$)=q and cut(g)=(B, $\overline{B}$). Then B ⊂ A.

Lemma 31: Algorithm 29 terminates with cut (U, $\overline{U}$) and price p* in at most r max-flow computations, where r is the number of sinks.

Continuing the discussion with the structure of markets 1 and 2, a market having only one agent is clearly an SUA market. We give Example 37 to show that Market 1 is not a UUA market for k≧2, where k is the number of agents (source-sink pairs). For Market 2, we will use Hu's Theorem, Theorem 32, to show that it is an SUA market for k=2, and it is not a UUA market for k≧3 (Example 36).

Let F be the maximum flow that can be routed from $s_1$ to $t_1$ and $s_2$ to $t_2$ simultaneously, e.g., maximize the sum of flow that can be routed subject to edge capacity constraints. Hu shows that F equals the minimum cut separating both pairs of terminals. There are two possibilities for such a cut: (1) it either separates $s_1$ and $s_2$ from $t_1$ and $t_2$ or it separates $s_1$ and $t_2$ from $s_2$ and $t_1$. Obtaining min-cuts for both cases and keeping the smaller will give the correct answer.

Let S denote the set of edges in this min-cut; clearly, its capacity is F. Let $F_i$ be the value of max-flow from $s_i$ to $t_i$ and $S_i$ be the set of edges in a min-cut separating $s_i$ and $t_i$, for i=1, 2. Hu also showed the following theorem which characterizes the region of feasible flow.

Theorem 32 (Hu): Let $f_1$ and $f_2$ be two non-negative real numbers such that $f_1 \leq F_1$, $f_2 \leq F_2$ and $f_1 + f_2 \leq F$. Then there exists a feasible flow which carries $f_1$ amount of flow from $s_1$ to $t_1$ and $f_2$ amount of flow from $s_2$ to $t_2$.

Lemma 33: Let $v: A \rightarrow R_+$ be a function satisfying the covering property and that $v(\emptyset)=0$. Then v is submodular.

Theorem 32 and Lemma 33 give:

Corollary 34: Market 2 is an SUA market for the case of two source-sink pairs.

Hence, the solutions component can utilize Algorithm (6) to compute equilibrium for this case in strongly polynomial time. We give below are more efficient algorithm by invoking Theorem 32. The following lemma applies a useful restriction.

Lemma 35: At most one of the following conditions can be violated:

$$m_1/(m_1+m_2) \leq F_1/F$$

$$m_1/(m_1+m_2) \leq F_2/F$$

Example 36: We give an example to show that Market 2 is not a UUA market for the case of two source-sink pairs. Consider a directed graph with two source-sink pairs, $s_1, t_1$ and $s_2, t_2$, and additional vertices $a_i, b_i$, for $1 \leq i \leq n$. The graph has the following edges, all of unit capacity: for $1 \leq i \leq n$ the edges $(s_2, a_i), (a_i, h_i), (b_i, t_2)$, for $1 \leq i \leq n-1$ the edges $(b_i, a_{i+1})$, and the edges $(s_1, a_1), (b_n, t_1)$.

Let $f_1(f_2)$ be the flow sent from $s_1$ to $t_1$ ($s_2$ to $t_2$). The packing constraint in the Eisenberg-Gale-type convex program is:

$$nf_1 + f_2 \leq n,$$

hence, showing that this is not a UUA market.

Example 37: Using a known example, it can be shown that Market 1 is not a UUA market for the case of three source-sink pairs. Consider an undirected graph with three source-sink pairs, $s_1$–$t_1$, $s_2$–$t_2$ and $s_3$–$t_3$, and the edges: $(s_1, s_2)$, $(s_1, s_3)$, $(s_1, t_2)$, $(s_2, t_1)$, $(s_2, s_3)$, $(t_1, t_2)$, $(t_1, s_3)$, $(t_2, s_3)$, all of unit capacity. Let $f_1, f_2, f_3$ be the flows sent on the three source-sink pairs. Capacity constraints imply:

$$f_1 \leq 3, f_2 \leq 3, f_3 \leq 2$$

$$f_1 + f_2 \leq 4, f_1 + f_3 \leq 3, f_2 + f_3 \leq 3$$

$$f_1 + f_2 + f_3 \leq 4$$

On the other hand, the flow $f_1=1, f_2=1, f_3=2$, which satisfies all these constraints, typically cannot be routed.

Using Theorem 38 it can be shown that Market 4 is a SUA market. One can also use this theorem to give a strongly polynomial algorithm for this market that is more efficient than Algorithm 6. Assume that agent s has money $m_s, s \in A$ and m is the total money with the agents. Observe that this market is quite different from the others in that each agent desires the same objects, namely spanning trees.

For a partition $V_1, \ldots, V_k$, $k \leq 2$ of the vertices, let C be the capacity of edges whose end points are in different parts. Let us define the edge-tenacity of this partition to be $C/(k-1)$, and let us define the "edge-tenacity" of G to be the minimum edge-tenacity over all partitions. We will use the following max-min relation.

Theorem 38 (Nash-William; and Tutte): The maximum fractional packing of spanning trees in an undirected graph is exactly equal to its edge-tenacity.

Let t be the edge-tenacity of the given graph and $f_s$ be the number of spanning trees allocated to agent s, $s \in A$. The packing constraints on these variables are $$\sum_{i \in S} f_i \leq t,$$

for any $S \subseteq A$. This is clearly a SUA market.

Find the partition with minimum edge-tenacity using e.g., known algorithms. Let C be the capacity of all the crossing edges of the partition and k the number of parts. Compute the maximum fractional packing of spanning trees. This fractional packing will saturate all the crossing edges of the partition. Also note that each spanning tree in the packing will be using exactly k−1 crossing edges of the partition. Price the crossing edges of the partition at rate m/C and assign $m_s/m$ trees to agent s. It is easy to see that all KKT conditions are satisfied.

Taking a closer look at the structure of Market 3, one can first use Edmonds' Theorem, Theorem 39, to show that Market 3 is a UUA market. In addition, it can be demonstrated that it is an SUA market if and only if $k \leq 2$, where k is the number of sources.

Theorem 39 (Edmonds): Let G=(V, E) be a directed graph with edge capacities specified and source $s \in V$ The maximum number of branchings rooted out of s that can be packed in G equals $\min_{v \in V} c(v)$, where c(v) is the capacity of a minimum s–v cut.

Let M be a market defined via directed graph G=(V, E) with edge capacities specified. Assume that the set of sources of this market is $A=\{s_1, \ldots, s_k\}$, $S \subseteq V$. Assume that the money of source $s_i$ is $m_i$. Define function $v: A \rightarrow R_+$ as follows. For $S \subseteq A$, let v(S) be the capacity of the minimum cut separating a vertex in V−S from S.

Theorem 40: We can pack in G, $f_i$ branchings rooted at $s_i$, for $1 \leq i \leq k$, simultaneously if and only if:

$$\forall S \subseteq A: \sum_{i \in S} f_i \leq v(S).$$

Corollary 41: Market 3 is a UUA market.

This is additionally an SUA market for the case of at most two sources—this follows from at least Lemma 33. For three or more sources, this market is not an SUA market as shown below.

Example 42: Consider a directed graph on vertex set A={a, b, c} and four edges (a, b), (b, a), (c, b), (b, c), with capacities 10, 1, 10, 2, respectively. Assume that a, b and c are all sources. Let function $v: 2^A \rightarrow R_+$ specifies the maximum number of branchings that can be rooted at subsets of A. Now, the capacity of (b, a) gives the constraint v({b, c})=1 and the capacity of (b, c) gives v({a, c})=2. It is a simple matter to understand that v({c})=1 and v({a, b, c})=3. Therefore, v is not submodular.

Finally, we give more efficient algorithms for the case of at most two sources. If the market has only one source, equilibrium follows in a straightforward manner from Edmonds' theorem. Let v be a vertex attaining the minimum in Theorem 39, and C be the set of edges in a min s–v cut. Price the edges of C at rate m/cap(C) where m is the money within the source.

Next assume the market has two sources $s_1, s_2$ with money $m_1, m_2$, respectively. Let $F_1$ and $F_2$ be capacities of a minimum $s_1-s_2$ and $s_2-s_1$ cut, respectively. Let F be $\min_{v \in V}\{s_1, s_2\} f'(v)$, where $f'(v)$ is the capacity of a minimum cut separating v from $s_1$ and $S_2$. The next corollary follows from Theorem 40 and is analogous to Theorem 32.

Corollary 43: The maximum number of branchings, rooted at $s_1$ and $s_2$, that can be packed in G is exactly $\min\{F_1+F_2, F\}$.

Let $f_1$ and $f_2$ be two non-negative real numbers such that $f_1 \leq F_1, f_2 \leq F_2$ and $f_1+f_2 \leq F$. Then there exists a packing of branchings in G with $f_1$ of them, rooted at $s_1$, and $f_2$ of them rooted at $s_2$.

Cases infra can be employed to illustrate how to utilize Corollary 43 to compute equilibrium prices and allocations. In particular, the solutions component 104 can distinguish between four different cases:

Case 0: $F_1+F_2<F$.

In this case, simultaneously, $F_1$ branchings can be rooted at $s_1$ and $F_2$ branchings can be rooted at $s_2$, and clearly, neither root can support more branchings individually. Consider such a packing of branchings. Let $c_1$ be the set of edges in a minimum $s_1-s_2$ cut (which is of capacity $F_1$) and $c_2$ be the set of edges in a minimum $s_2-s_1$ cut. Clearly, this packing must saturate both these cuts and therefore they must be disjoint. Now price edges of $c_1$ at rate $m_1/cap(c_1)$ and edges of $c_2$ at rate $m_2/cap(c_2)$. Clearly, all KKT conditions are satisfied.

Next assume that $F \leq F_1+F_2$. Now, the situation is completely analogous to situations above, and the three cases given there yield equilibrium prices and allocations.

Before review the other cases, a further word on efficiency of capacity allocation markets is in order. Each of the capacity allocation markets for which we have obtained strongly polynomial algorithms are also SUA markets. Therefore, by Theorem 3 they have efficiency 1. We next give bounds on the efficiency of the remaining markets. In particular multiple source-sink markets for directed and undirected graphs.

We first give an example to show that for the case of directed graphs, the efficiency of the corresponding market can be arbitrarily small, even for only two source-sink pairs.

Example 44: Consider the graph given in Example 37. The maximum number of flow paths this graph supports is the n paths from $s_2$ to $t_2$. Assume the pair $s_1, t_1$ has $H, where H is a large number, and the pair $s_2, t_2$ has $1. In this case the equilibrium is $1-\in$ path from $s_1$ to $t_1$ and $\in n$ paths from $s_2$ to $t_2$, where $\in$ approaches 0 as H approaches infinity. Therefore, the efficiency of this market approaches $1/n$, and hence can be made arbitrarily small.

In contrast, for the case of undirected graphs, the efficiency of this market is a function of the number of source-sink pairs. Typically, at least $1/(2k-1)$ where k is the number of source-sink pairs. The best upper bounding example we have is $1/(k-1)$.

Consider a valid flow that sends $f_i$ flow for the i-th source-sink pair, for $1 \leq i \leq k$. We will say that this flow is Paretto optimal if none of the $f_i$'s can be increased, e.g. this can be maximal, though not necessarily maximum flow.

Lemma 45: Let $f_1, f_2, \ldots, f_k$ be a Paretto optimal assignment of flows, then $$f_1 + f_2 + \ldots + f_k \leq \frac{1}{2k-1} OPT,$$

where OPT is the maximum multicommodity flow that can be sent in G.

Since any market equilibrium must be Paretto optimal, we get:

Theorem 46: The efficiency of multiple source-sink market for undirected graphs is at least $1/(2k-1)$ where k is the number of source-sink pairs.

Example 47: We give an example showing an upper bound of essentially $1/(k-1)$ on the efficiency of this market. The graph is a path of length k-1 on vertices $v_1, \ldots v_k$, consisting of unit capacity edges. There are k source-sink pairs: $(v_i, v_{i+1})$, for $1 \leq i \leq k-1$, and $(v_1, v_k)$. The maximum multicommodity flow has value k-1 and sends one unit of flow on the first k-1 source-sink pairs. Next, suppose each of the first k-1 source-sink pairs have $1 and $(v_1, v_k)$ has $H, where H is a large number. Now, the equilibrium will send $1-\in$ flow of the last commodity and $\in$ flow of the remaining k-1 commodities, where $\in$ approaches zero as H approaches infinity.

In consideration of the branching market with three or more sources, let $A \subset V$ be the set of sources, with $|A| \leq 3$. For $S \subset V$, let in(S) denote the capacity of edges incoming into set, S, and out(S) denote the capacity of edges outgoing from set S. Let $B_1 = \min\{in(S)\}$, where the minimum is over all sets of vertices such that $S \cap A = \emptyset$, $S \neq 0$. Let $B_2 = \min\{in(S_1)+in(S_2)\}$, where the minimum is over all disjoint sets of vertices $S_1$ and $S_2$. Let $B = \min\{B_1, B_2\}$.

We will first upper bound the optimum number of branchings that can be packed in G. Note that such a step is critical in developing an approximation algorithm for an NP-hard maximization problem. Our reason is different; in fact in our case, the optimum number can be computed in polynomial time via a linear program.

Lemma 48: B is an upper bound on the number of branchings, rooted at vertices of A, that can be packed in G.

Lemma 49: For any Paretto optimal packing, $F = f_1 + \ldots + f_k \geq B/2$.

Returning now to the four cases mentioned above, case 1 is as follows:

Case 1: There exist two minimal such sets, say $S_1$ and $S_2$.

Clearly, $S_1$ and $S_2$ must be tight in the packing being considered in G. Assume w.l.o.g., that $in(S_1) \geq in(S_2)$. By Lemma 48, $in(S_1) \geq B/2$. Note that the in-capacities of these sets are being considered in graph G, e.g. without the edges $(s, s_i)$, $1 \leq i \leq k$. Now, since $s_1$ is tight, $F \geq in(S_1) > B/2$.

Case 2: There exists only one minimal such set, S, and $S \cap A = \emptyset$.

Since S is tight, and it does not contain any sources, $F = in(S) \geq B$.

Case 3: There exists only one minimal such set, S, and $S_i \in (S \cap A)$.

In this case, all minimum s-v cuts in G' must contain S. Therefore, edge $(s, s_i)$ is contained in each of these cuts. Therefore, we can increase the capacity of this edge to $f_i + \in$ for a small $\in > 0$ without introducing a new min-cut. Now, by Edmonds' theorem, the maximum number of branchings rooted at s that can be packed in G' is the in-capacity of S in G' and is $F+\in$, with $f_i + \in$ of them using the edge $(s, s_j)$. This contradicts Paretto optimality of the packing. Hence this case cannot arise.

Theorem 50: The efficiency of the branching market is $\geq 1/2$.

Remark 51: Observe that for the case of two sources, by Theorem 40 and Corollary 41, any Paretto optimal solution is exactly B, hence leading to efficiency 1.

Example 52: We next give an example to show that the efficiency of this market can be arbitrarily close to $1/2$. Consider a directed graph on three vertices, a, b, c and edges (a, b), (c, b) of capacity infinity and (b, a), (b, c) of capacity 1. All three of these vertices are sources, with a and c having $1 each and b having $H, where H is a large number. The optimum solution is to build one branching each at a and c; however, the market equilibrium builds 1−∈ branching at b and ∈ branching each at a and c. Hence, the efficiency of this market approaches ½ as H approaches infinity.

Considering, inter alia, the rationality of equilibria, clearly, for each of the markets for which we obtain a strongly polynomial algorithm, there generally is always a rational equilibrium allocation and prices, provided the input is all rational. For most of the remaining markets, we provide instances that have only irrational solutions.

Example 53: For Markets 1 and 2, if there are two sources and three or more sinks, an irrationality example was given in Garg, et. al. We state it again for sake of completeness. Consider a graph on three nodes {a, b, c} and two edges (a, b), (b, c). Let the capacity of (a, b) be one and the capacity of (b, c) be two. The source sink pairs are: a-b, a-c, and b-c. Each source-sink pair has $1. Now, the equilibrium price for (a, b) is $\sqrt{3}$ and for (b, c) it is $$\frac{\sqrt{3}}{1+\sqrt{3}}.$$

Next, let us consider the model suggested by Kelly and Vazirani. Suppose we have a single-source multiple-sink network; however, each sink derives different utilities on getting flow along different paths. The following example admits only irrational prices.

Example 54: The example is essentially the same as Example 53, except that there is a parallel edge (a, b) of very large capacity. Assume source-sink pair a-c prefers to get flow using this edge and the edge (b, c). The remaining source-sink pairs desire flows in the original graph. Clearly, the prices given above apply.

We next give an example having only irrational solutions for Market 3 for the case of three sources.

Example 55: The graph is the same as that in Example 42. It has three vertices a, b, and c and four edges (a, b), (b, a), (c, b), (b, c), with capacities 10, 1, 10, 2, respectively. Assume that a, b, and c have $1 each. Clearly the price of incoming edges into b is zero, because these edges typically cannot be saturated. One can check that at equilibrium, the price of (b, a) is $\sqrt{3}$ and the price of (b, c) is $(3-\sqrt{3})/2$. One can also check that there is no other equilibrium. Note, that this is related to the tight example provided supra.

Next, a brief discussion of the rationality of equilibria for UUA markets is provided. By Corollary 41 the last example with three sources is a UUA market, thereby showing that there are UUA markets which have only irrational solutions. Algorithm 6 shows that SUA markets always have rational equilibria if all input parameters are rational. This raises the following question: Does rationality of equilibria characterize SUA markets within the class of UUA markets? We show below that the answer to this question is "no" by giving an instance of a UUA market which is not a SUA market and yet it has rational solutions.

Example 56: Let A={i, j, k} and define v as follows: v{i}=v{j}=v{k}=v{i,j}=v{j,k}={i,k}=2; and v{i,j,k}=3. Note that v is not submodular. Moreover, it can be argued that the UUA market M.{v} has rational equilibria when $m_i$, $m_j$, $m_k$, are rational.

By KKT conditions, only tight sets can have positive prices. The only way A can be tight is if $u_i=u_j=u_k=1$. This is so because the sum of any two utilities is bounded by 2, so the third utility must be 1 to ensure that their sum is 3. This is a rational equilibrium.

Next, assume that A is not tight. If singleton set {i} is tight then the utilities must be $u_i=2$, $u_j=u_k=0$, which is also rational. So we may assume that no singleton set is tight.

Now the only tight sets must have cardinality two. There are three cases. All the three cardinality two sets can be tight only for $u_i=u_j=u_k=1$, which is rational. If only one of the cardinality two sets is tight, say {i, j}, then $m_k=0$ and $p_{\{i,j\}}=\{m_i+m_j\}/2$. For rational $m_i$ and $m_j$, this solution is rational.

In the last case two of the cardinality two sets are tight, say {i, j} and {j,k}. Let their prices be $p_{\{i,j\}}$ and $p_{\{j,k\}}$. We get the following two equations at equilibrium.

$$\frac{m_i}{p_{\{i,j\}}} + \frac{m_j}{p_{\{i,j\}}+p_{\{j,k\}}} = 2$$

$$\frac{m_k}{p_{\{j,k\}}} + \frac{m_j}{p_{\{i,j\}}+p_{\{j,k\}}} = 2$$

These two equations give:

$$\frac{m_i}{p_{\{i,j\}}} = \frac{m_k}{p_{\{j,k\}}}$$

Substituting the value of $p_{\{i,j\}}$ in terms of $p_{\{j,k\}}$ either of the two equations yields rational values for both prices. Observe that the efficiency of this market is at least ⅔. A brief summary of the foregoing with respect to markets is provided with reference to FIG. 3.

Figure 3:
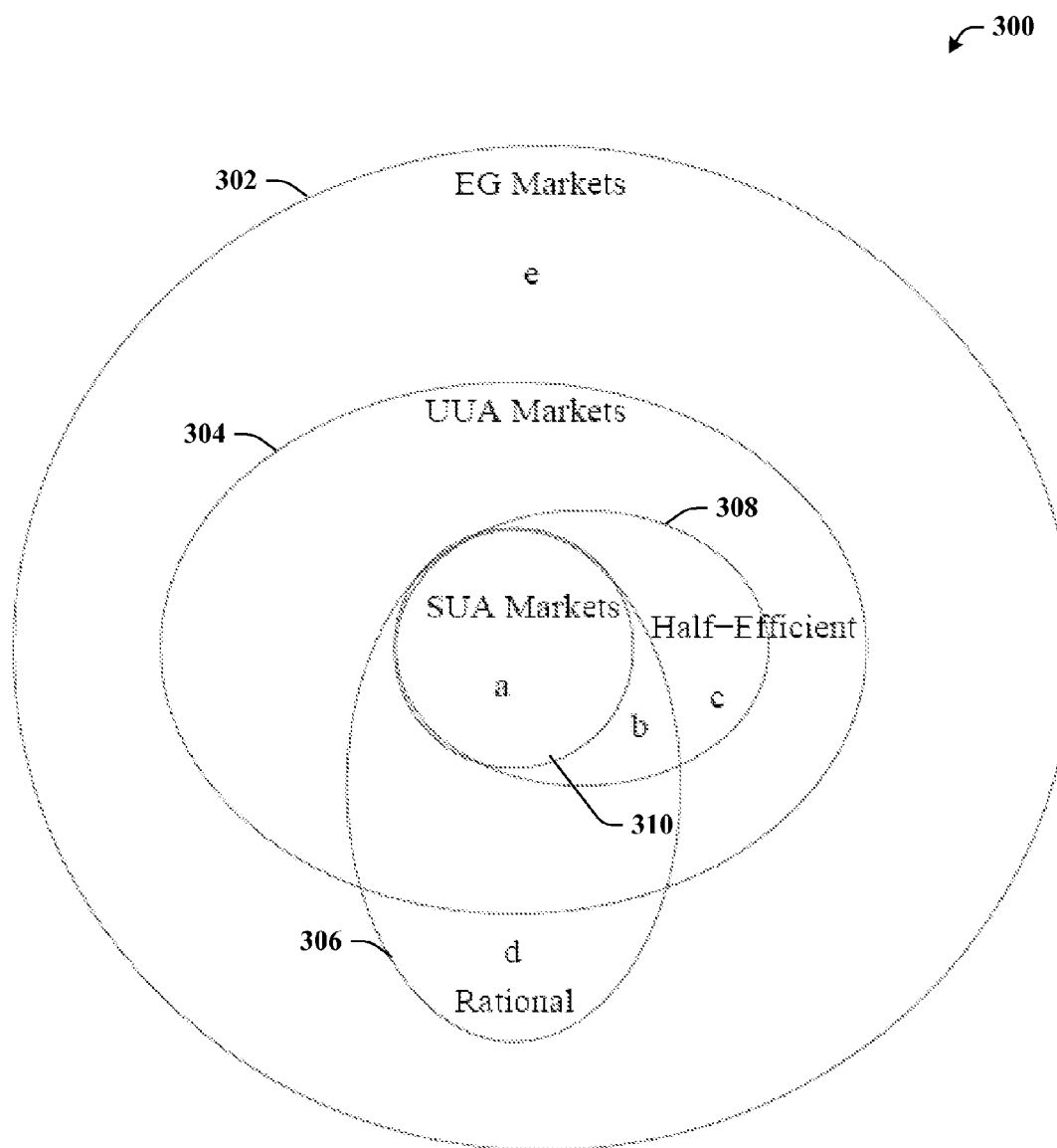
FIG. 3 depicts a graphical illustration of an example Venn diagram of a variety of markets.

Turning now to FIG. 3, an example Venn diagram 300 of markets is illustrated. Reference numeral 302 refers to all Eisenberg-Gale type markets, which includes UUA markets 304 and rational markets 306. Rational markets 306 can represent the set of markets having rational solutions. Half-efficient markets 308 can represent the subset of UUA markets 304 that have an efficiency of at least ½. In addition, the Venn diagram 300 also includes SUA markets 310. The reference letters, a, b, c, d, and e represent markets according to the following:
  a: The single-source multiple-sink market.
  b: The market of Example 56.
  c: The market of Example 42.
  d: The linear utilities case of Fisher's model.
  e: The Leontief utilities case of Fisher's mode. Leontief utilities are defined as follows: Each buyer i is interested in a subset $S_i$ of goods and has coefficient $u_{ij}>0$, for $j \in S_i$. For allocation x, the utility of buyer i is $\min_{j \in S_i} u_{ij} x_{ij}$.

As mentioned supra, finding combinatorial algorithms for solving special classes of linear programs has been extremely valuable in combinatorial optimization. The disclosed aspects relating to this domain of work to convex programs has provided new insights into the efficiency and fairness of markets. For example, a natural adaptation of the primal-dual schema, by relaxing complementary slackness conditions, has led to extremely useful approximation algorithms for several fundamental NP-hard optimization problems. Accordingly, there should be a corresponding adaptation of this schema for approximately solving nonlinear convex programs.

The phenomenal success of TCP, and, in particular, the congestion control protocol of Jacobson, has played a central role in the unprecedented growth of the Internet. These protocols have scaled gracefully all the way from a small-scale research network to today's Internet with the tens of millions of end nodes and links, the highly heterogeneous composition and growth, and the very diverse collection of users and applications. This remarkable success has attracted much theoretical study, with a view to designing next generation protocols. This activity was so far centered around continuous time algorithms, which do not have time-efficiency guarantees. In asking for polynomial time algorithms for computing equilibria, it has been stated, "Continuous time algorithms similar to TCP are known, but insights from discrete algorithms may be provocative". Considering the simplicity of our algorithms and their natural description as ascending price auctions, one wonders if they can provide new insights into the design of congestion control protocols.

Submodular flows can generalize several optimization problems. It will be interesting to see if the corresponding market, when defined with a single source and multiple sinks, admits a strongly polynomial algorithm. The recent idea of network coding in information theory opens up the possibility of using more general structures than branchings for broadcasting: for example, given a directed graph G=(V, E) consisting of terminals and Steiner nodes; a subset of the terminals are designated to be sources. An object for source s is a subgraph of G (which, in general, picks edges fractionally) rooted at s and allowing one unit of flow from s to each terminal. If s buys k objects, then it can broadcast at rate k to all terminals, using network coding. What, then, is the structure of this market wit respect to classes UUA and SUA? Observe that a slight generalization of Kelly's framework is required for formally defining this market since an object picks resources fractionally.

Figure 4:
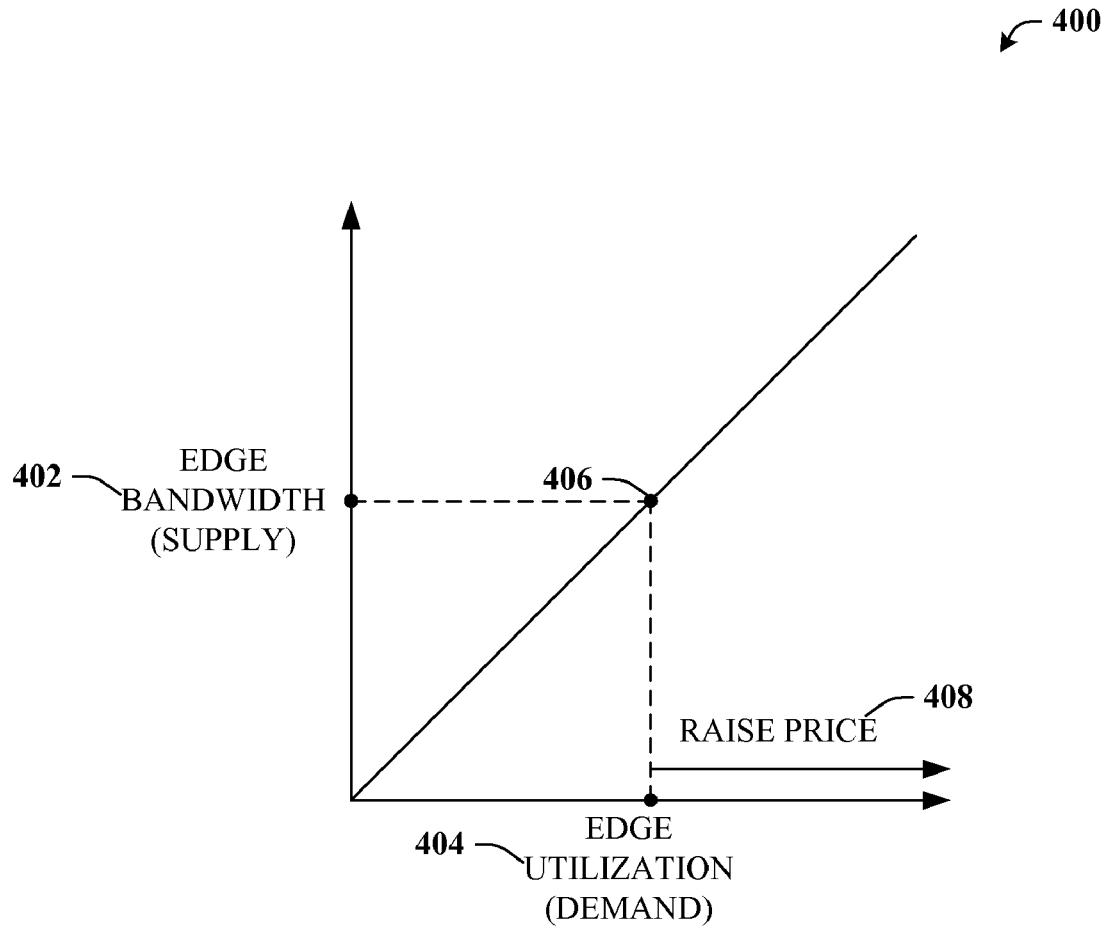
FIG. 4 is an exemplary graph of utilization demand versus bandwidth supply with an approach of raising utilization costs when utilization exceeds equilibrium.

Briefly, with reference now to FIG. 4, an exemplary graph 400 of utilization demand versus bandwidth supply with an approach of raising utilization costs when utilization exceeds equilibrium is illustrated. In accordance with one aspect, each of the edges 106 can have an exemplary bandwidth 402 that can, e.g., represent supply. In addition, each of the edges 106 can be exposed to a particular utilization 404 (which can denote demand) from market/network participants. In some cases, when supply 402 equals demand 404, then the edge 106 is deemed to be in equilibrium 406. Yet if demand 404 is in excess of the supply 402, then a price increase 408 can provide an economic incentive to return the edge 106 to equilibrium 406. It is to be appreciated that such a price increase 408 can be determined by, e.g., the solutions component 104 and implemented by the budget component 110.

Figure 5:
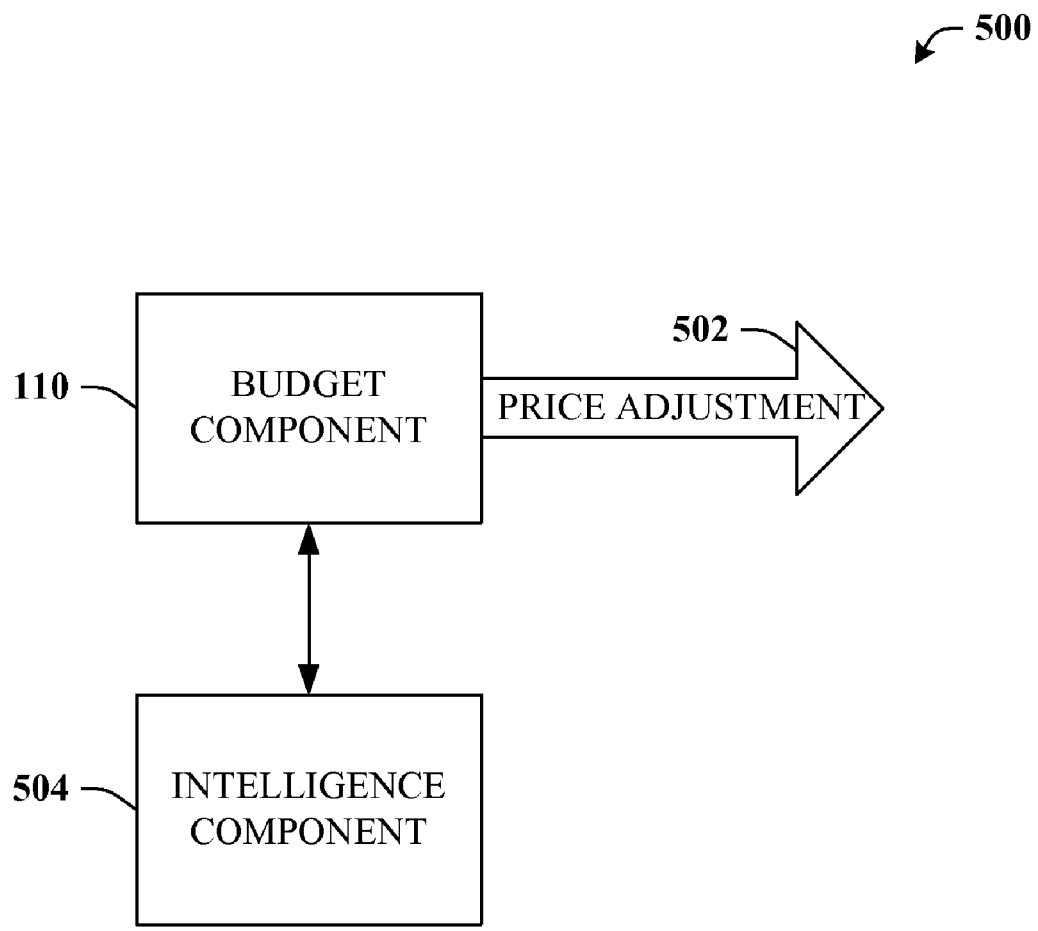
FIG. 5 depicts a computer-implemented system that implements price adjustments to facilitate equilibrium for an NRAM.

Turning to FIG. 5, a computer-implemented system 500 that implements price adjustments to facilitate equilibrium for an NRAM can be found. Generally, the system 500 can include the budget component 110 that can transmit a price adjustment 502 (e.g., modify a price associated with utilization of an edge, a set of edges, and/or a subset of edges). As detailed in connection with FIG. 1, the amount of the price adjustment 502 can be predetermined. However, in other cases, the amount of the price adjustment 502 can be dynamically inferred.

In accordance therewith, the system 500 can also include an intelligence component that can, inter alia, determine or infer an amount for the price adjustment 502. Such an inference can be based upon a wide variety of factors, such as a type of market, a number and/or type of market participants, the supply or demand with respect to an edge or set of edges, historical data, infrastructure, demographics and so forth. The intelligence component 504 can examine the entirety or a subset of the data available and can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data.

Such inference results in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the claimed subject matter.

A classifier can be a function that maps an input attribute vector, $x=(x1, x2, x3, x4, xn)$, to a confidence that the input belongs to a class, that is, $f(x)=\text{confidence}(\text{class})$. Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, where the hypersurface attempts to split the triggering criteria from the non-triggering events. Intuitively, this makes the classification correct for testing data that is near, but not identical to training data. Other directed and undirected model classification approaches include, e.g. naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

Figure 6:
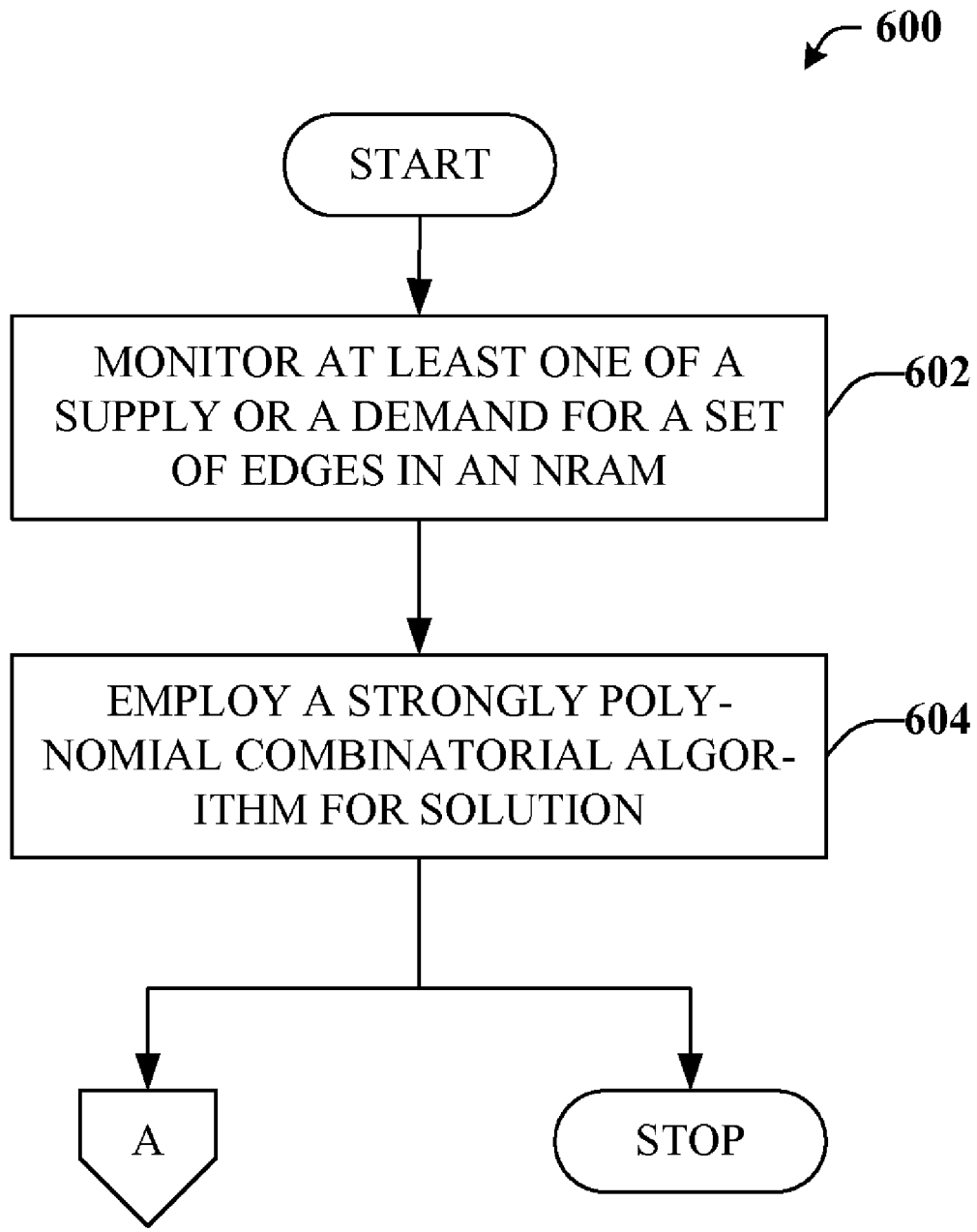
FIG. 6 is an exemplary computer implemented method for facilitating equilibrium for a natural resource allocation market.
Figure 7:
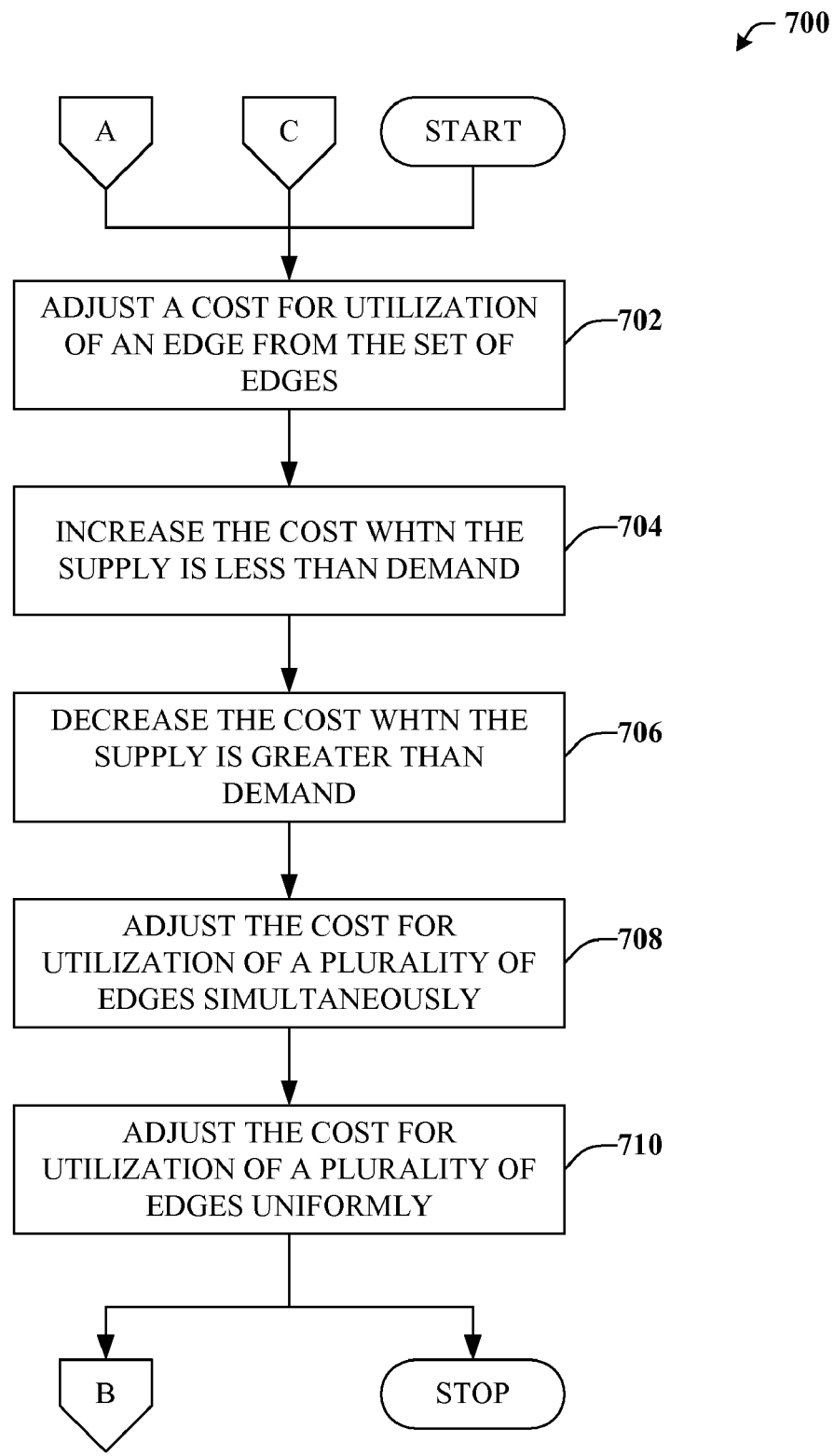
FIG. 7 depicts an exemplary computer implemented method for adjusting costs for facilitating equilibrium in a natural resource allocation market.
Figure 8:
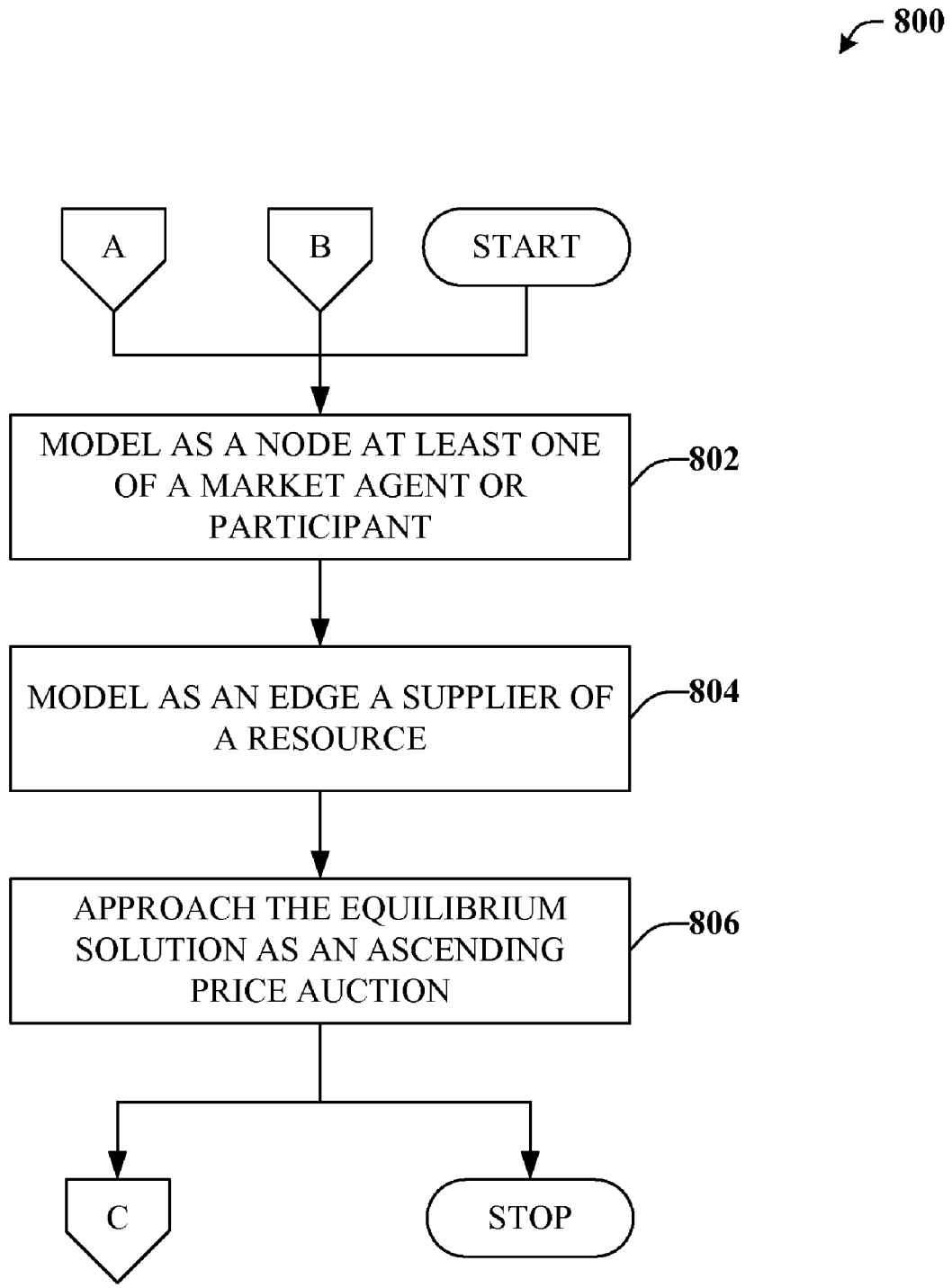
FIG. 8 illustrates an exemplary computer implemented method for modeling approaches to facilitating equilibrium in a natural resource allocation market.

FIGS. 6, 7, and 8 illustrate various methodologies in accordance with the claimed subject matter. While, for purposes of simplicity of explanation, the methodologies are shown and described as a series of acts, it is to be understood and appreciated that the claimed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Turning now to FIG. 6, an exemplary computer implemented method 600 for facilitating equilibrium for a natural resource allocation market is depicted. In general, at reference numeral 602, at least one of a supply or a demand for a set of edges in a natural resource allocation market can be monitored. For example, an edge can exhibit characteristics such as saturation, under-supply, or, in the case of computer networks, congestion. These and other properties with respect to a set of edges can be monitored.

At reference numeral 604, a strongly polynomial combinatorial algorithm for determining an equilibrium solution for the set of edges can be employed. Conventional equilibrium solutions rely upon continuous time convex programs, whereas the claimed subject matter can determine the equilibrium solution in polynomial time or even strongly polynomial time.

With reference to FIG. 7, an exemplary computer implemented method 700 for adjusting costs for facilitating equilibrium in a natural resource allocation market is illustrated. At reference numeral 702, a cost for utilization of an edge from the set of edges can be adjusted. Typically, such as in the case of under-supply, the cost for utilization of the edge can be increased, however, it should be appreciated that the cost can also be decreased, such as when the edge is no longer undersupplied, which is described in more detail infra.

At reference numeral 704, the cost can be increased when the supply is less than the demand (e.g., the edge undersupplied, saturated, congested, or the like). At reference numeral 706, the cost can be decreased when the supply is greater than the demand (e.g. under-utilization). At reference numeral 708, the cost of utilization for a plurality of edges from the set of edges can be adjusted simultaneously. For example, the price of utilization of all edges from the set of edges that exhibit characteristics indicating supply is less than demand can be adjusted upward simultaneously. At reference numeral 710, the cost of utilization for a plurality of edges from the set of edges can be adjusted uniformly. For instance, in addition to adjusting prices simultaneously, prices can be adjusted by a uniform amount as well.

Turning to FIG. 8, an exemplary computer implemented method 800 for modeling approaches to facilitating equilibrium in a natural resource allocation market is depicted. Generally, at reference numeral 802, at least one of a natural resource allocation market agent or participant (e.g., a buyer) can be modeled as a node. At reference numeral 804, a supplier of a resource can be modeled as an edge. It is to be appreciated that the edge can be modeled with attributes or characteristics associated with the utilization of the edge by agents, and/or supply of the resource. At reference numeral 806, the equilibrium solution and/or models relating to the equilibrium solution can be approached as an ascending price auction to expose heretofore unknown insights into equilibrium solutions and/or algorithms associated therewith.

Figure 9:
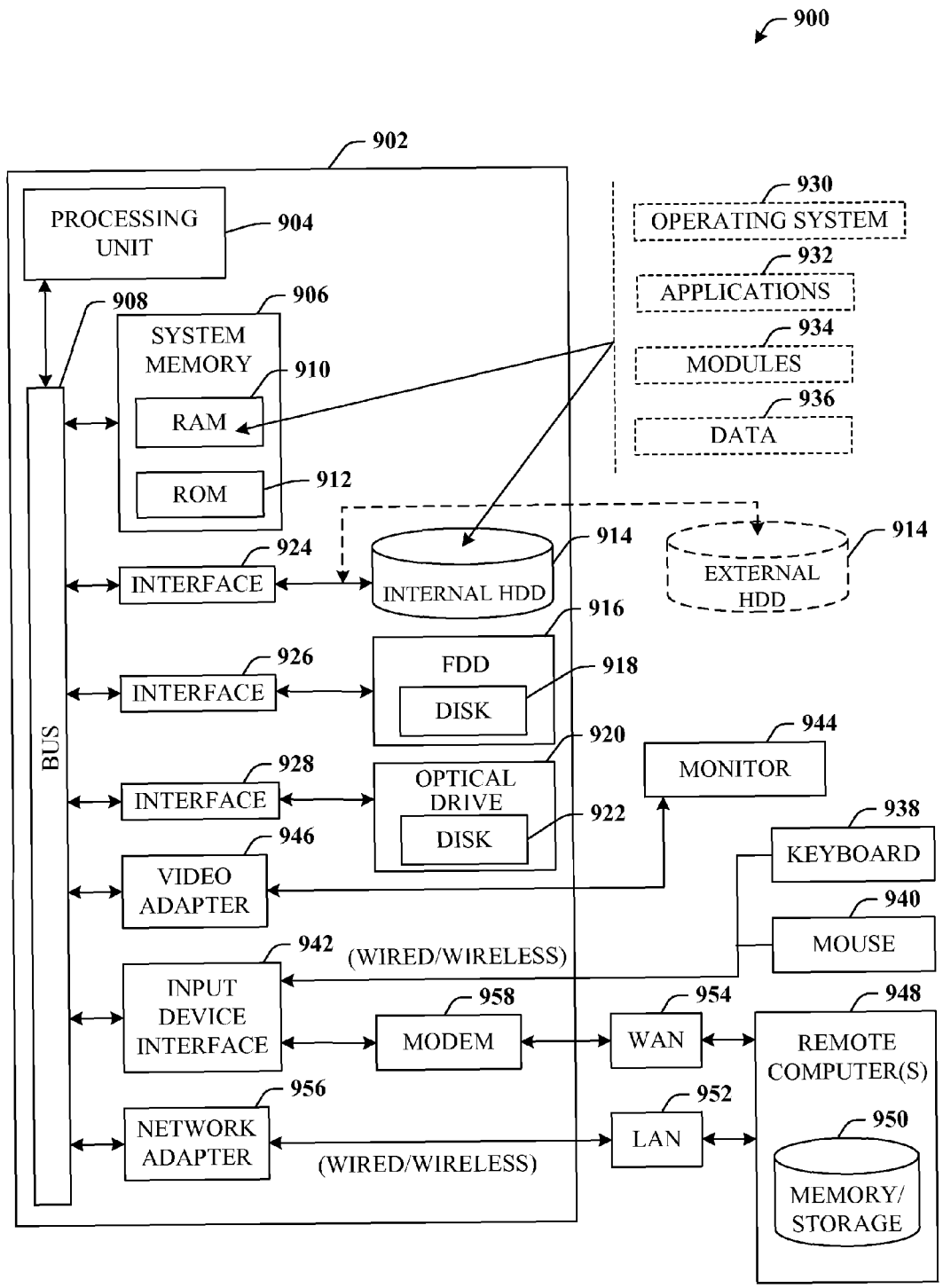
FIG. 9 illustrates a block diagram of a computer operable to execute the disclosed architecture.

Referring now to FIG. 9, there is illustrated a block diagram of an exemplary computer system operable to execute the disclosed architecture. In order to provide additional context for various aspects of the subject invention, FIG. 9 and the following discussion are intended to provide a brief, general description of a suitable computing environment 900 in which the various aspects of the invention can be implemented. Additionally, while the invention has been described above in the general context of computer-executable instructions that may run on one or more computers, those skilled in the art will recognize that the invention also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the invention may also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media can include both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

With reference again to FIG. 9, the exemplary environment 900 for implementing various aspects of the invention includes a computer 902, the computer 902 including a processing unit 904, a system memory 906 and a system bus 908. The system bus 908 couples to system components including, but not limited to, the system memory 906 to the processing unit 904. The processing unit 904 can be any of various commercially available processors. Dual microprocessors and other multi-processor architectures may also be employed as the processing unit 904.

The system bus 908 can be any of several types of bus structure that may further interconnect to a memory bus (with or without a memory controller), a peripheral bus, and a local bus using any of a variety of commercially available bus architectures. The system memory 906 includes read-only memory (ROM) 910 and random access memory (RAM) 912. A basic input/output system (BIOS) is stored in a non-volatile memory 910 such as ROM, EPROM, EEPROM, which BIOS contains the basic routines that help to transfer information between elements within the computer 902, such as during start-up. The RAM 912 can also include a high-speed RAM such as static RAM for caching data.

The computer 902 further includes an internal hard disk drive (HDD) 914 (e.g., EIDE, SATA), which internal hard disk drive 914 may also be configured for external use in a suitable chassis (not shown), a magnetic floppy disk drive (FDD) 916, (e.g., to read from or write to a removable diskette 918) and an optical disk drive 920, (e.g. reading a CD-ROM disk 922 or, to read from or write to other high capacity optical media such as the DVD). The hard disk drive 914, magnetic disk drive 916 and optical disk drive 920 can be connected to the system bus 908 by a hard disk drive interface 924, a magnetic disk drive interface 926 and an optical drive interface 928, respectively. The interface 924 for external drive implementations includes at least one or both of Universal Serial Bus (USB) and IEEE1394 interface technologies. Other external drive connection technologies are within contemplation of the subject invention.

The drives and their associated computer-readable media provide nonvolatile storage of data, data structures, computer-executable instructions, and so forth. For the computer 902, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the invention.

A number of program modules can be stored in the drives and RAM 912, including an operating system 930, one or more application programs 932, other program modules 934 and program data 936. All or portions of the operating system, applications, modules, and/or data can also be cached in the RAM 912. It is appreciated that the invention can be implemented with various commercially available operating systems or combinations of operating systems.

A user can enter commands and information into the computer 902 through one or more wired/wireless input devices, e.g. a keyboard 938 and a pointing device, such as a mouse 940. Other input devices (not shown) may include a microphone, an IR remote control, a joystick, a game pad, a stylus pen, touch screen, or the like. These and other input devices are often connected to the processing unit 904 through an input device interface 942 that is coupled to the system bus 908, but can be connected by other interfaces, such as a parallel port, an IEEE1394 serial port, a game port, a USB port, an IR interface, etc.

A monitor 944 or other type of display device is also connected to the system bus 908 via an interface, such as a video adapter 946. In addition to the monitor 944, a computer typically includes other peripheral output devices (not shown), such as speakers, printers, etc.

The computer 902 may operate in a networked environment using logical connections via wired and/or wireless communications to one or more remote computers, such as a remote computer(s) 948. The remote computer(s) 948 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 950 is illustrated. The logical connections depicted include wired/wireless connectivity to a local area network (LAN) 952 and/or larger networks, e.g., a wide area network (WAN) 954. Such LAN and WAN networking environments are commonplace in offices and companies, and facilitate enterprise-wide computer networks, such as intranets, all of which may connect to a global communications network, e.g. the Internet.

When used in a LAN networking environment, the computer 902 is connected to the local network 952 through a wired and/or wireless communication network interface or adapter 956. The adapter 956 may facilitate wired or wireless communication to the LAN 952, which may also include a wireless access point disposed thereon for communicating with the wireless adapter 956.

When used in a WAN networking environment, the computer 902 can include a modem 958, or is connected to a communications server on the WAN 954, or has other means for establishing communications over the WAN 954, such as by way of the Internet. The modem 958, which can be internal or external and a wired or wireless device, is connected to the system bus 908 via the serial port interface 942. In a networked environment, program modules depicted relative to the computer 902, or portions thereof, can be stored in the remote memory/storage device 950. It will be appreciated that the network connections shown are exemplary and other means of establishing a communications link between the computers can be used.

The computer 902 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g. computers, to send and receive data indoors and out; anywhere within the range of a base station. Wi-Fi networks use radio technologies called IEEE802.11 (a, b, g, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 9BaseT wired Ethernet networks used in many offices.

Figure 10:
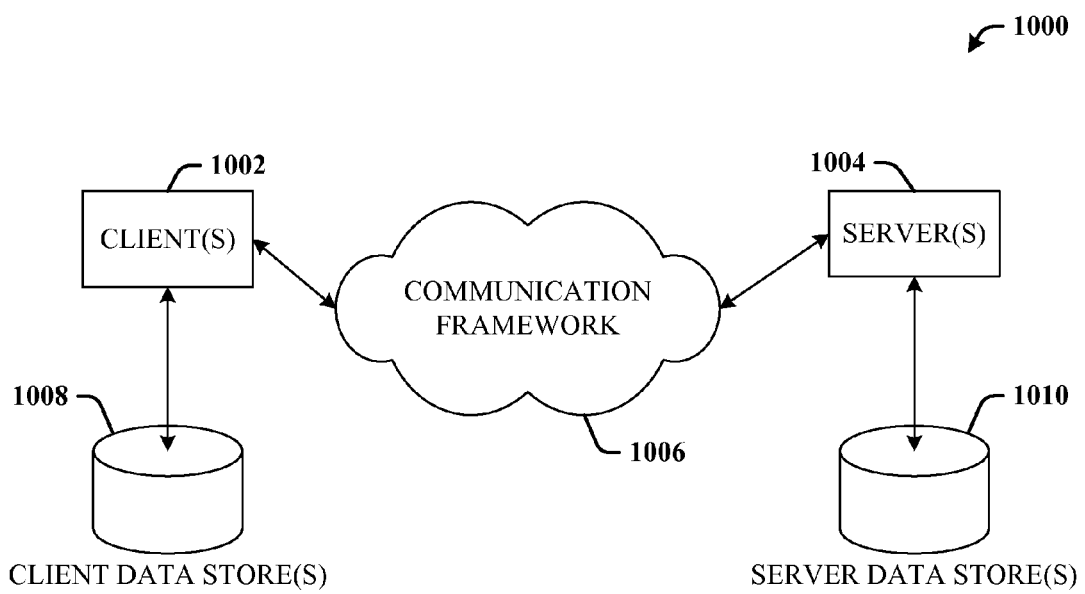
FIG. 10 illustrates a schematic block diagram of an exemplary computing environment.

Referring now to FIG. 10, there is illustrated a schematic block diagram of an exemplary computer compilation system operable to execute the disclosed architecture. The system 1000 includes one or more client(s) 1002. The client(s) 1002 can be hardware and/or software (e.g., threads, processes, computing devices). The client(s) 1002 can house cookie(s) and/or associated contextual information by employing the invention, for example.

The system 1000 also includes one or more server(s) 1004. The server(s) 1004 can also be hardware and/or software (e.g., threads, processes, computing devices). The servers 1004 can house threads to perform transformations by employing the invention, for example. One possible communication between a client 1002 and a server 1004 can be in the form of a data packet adapted to be transmitted between two or more computer processes. The data packet may include a cookie and/or associated contextual information, for example. The system 1000 includes a communication framework 1006 (e.g., a global communication network such as the Internet) that can be employed to facilitate communications between the client(s) 1002 and the server(s) 1004.

Communications can be facilitated via a wired (including optical fiber) and/or wireless technology. The client(s) 1002 are operatively connected to one or more client data store(s) 1008 that can be employed to store information local to the client(s) 1002 (e.g., cookie(s) and/or associated contextual information). Similarly, the server(s) 1004 are operatively connected to one or more server data store(s) 1010 that can be employed to store information local to the servers 1004.

It is to be understood that where not provided expressly in this disclosure, proofs for the theorems and lemmas herein exist in Appendix A of U.S. Provisional Application Ser. No. 60/863,714, filed Oct. 31, 2006, entitled "COMPUTING EQUILIBRIUM IN NETWORKS", the entirety of which has been incorporated by reference.

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g. a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A computer-implemented system that facilitates equilibrium for a natural resource allocation market, comprising:
    a memory;
    one or more processors operatively coupled to the memory and disposed within one or more devices;
    an analysis component disposed within one of the one or more devices that ascertains at least one of a supply or a demand for a set of edges in a natural resource allocation market; and
    a solutions component disposed within one of the one or more devices that employs a strongly polynomial combinatorial algorithm to determine an equilibrium solution to a convex program for the set of edges based in part on relaxing complementary slackness conditions.

2. The system of claim 1, the combinatorial algorithm converges to the equilibrium solution in strongly polynomial time.

3. The system of claim 1, the convex program is substantially similar to an Eisenberg-Gale program.

4. The system of claim 1, further comprising a budget component that modifies a price associated with utilization of an edge from the set of edges.

5. The system of claim 4, the budget component raises the price when the demand is greater than the supply for the edge.

6. The system of claim 4, the budget component lowers the price when the demand is less than the supply.

7. The system of claim 4, the budget component modifies the price by a predetermined amount.

8. The system of claim 4, the budget component modifies the price for a plurality of edges by a uniform amount.

9. The system of claim 8, the budget component modifies the price for the plurality of edges simultaneously.

10. The system of claim 1, the natural resource allocation market is a computer network environment and an edge from the set of edges is a network path between a first and a second network participant or agent.

11. The system of claim 10, the supply is bandwidth supply for the edge and the demand is demand utilization for the edge.

12. The system of claim 10, the solutions component determines the equilibrium solution for a point-to-point topology.

13. The system of claim 10, the solutions component determines the equilibrium solution for a broadcast topology.

14. A computer-implemented method for facilitating equilibrium for a natural resource allocation market, comprising:
    monitoring at least one of a supply or a demand for a set of edges in a natural resource allocation market; and
    employing, by a processor, a strongly polynomial combinatorial algorithm for determining an equilibrium solution to a convex program for the set of edges based in part on relaxing complementary slackness conditions.

15. The method of claim 14, further comprising at least one of the following acts:
    adjusting a cost for utilization of an edge from the set of edges;
    increasing the cost when the supply is less than the demand;
    decreasing the cost when the supply is greater than the demand;
    adjusting the cost of utilization for a plurality of edges from the set of edges simultaneously; or
    adjusting the cost of utilization for a plurality of edges from the set of edges uniformly.

16. The method of claim 14, further comprising at least one of the following acts:
    modeling as a node at least one of a natural resource allocation market agent or participant;
    modeling as an edge a supplier of a resource; or
    approaching the equilibrium solution as an ascending price auction.

17. The method of claim 14, the natural resource allocation market is a computer network environment.

18. One or more computer-readable storage devices encoded with instructions, that when executed by at least one processor, implement acts comprising:
    examining at least one of a supply or demand for a set of edges in a natural resource allocation market; and
    employing a strongly polynomial combinatorial algorithm for determining an equilibrium solution to a convex program for the set of edges based in part on relaxing complementary slackness conditions.

* * * * *